United States Patent
Nakatsuka et al.

(10) Patent No.: US 12,004,339 B2
(45) Date of Patent: Jun. 4, 2024

(54) SEMICONDUCTOR DEVICE AND METHOD OF MANUFACTURING THE SAME

(71) Applicant: Kioxia Corporation, Tokyo (JP)

(72) Inventors: Keisuke Nakatsuka, Kobe (JP); Takuya Ohoka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 52 days.

(21) Appl. No.: 17/643,277

(22) Filed: Dec. 8, 2021

(65) Prior Publication Data

US 2023/0051013 A1 Feb. 16, 2023

(30) Foreign Application Priority Data

Aug. 11, 2021 (JP) ................. 2021-131344

(51) Int. Cl.
*H10B 12/00* (2023.01)
(52) U.S. Cl.
CPC ............. *H10B 12/31* (2023.02); *H10B 12/01* (2023.02); *H10B 12/50* (2023.02)
(58) Field of Classification Search
CPC ......... H10B 12/31; H10B 12/01; H10B 12/50
See application file for complete search history.

(56) References Cited

U.S. PATENT DOCUMENTS

| | | | |
|---|---|---|---|
| 2018/0261575 A1* | 9/2018 | Tagami | H10B 41/10 |
| 2019/0287955 A1* | 9/2019 | Iijima | H01L 25/0657 |
| 2020/0295037 A1* | 9/2020 | Iijima | H01L 23/5226 |
| 2022/0310613 A1* | 9/2022 | Okajima | H01L 29/7869 |

* cited by examiner

*Primary Examiner* — Edward Chin
(74) *Attorney, Agent, or Firm* — Oblon, McClelland, Maier & Neustadt, L.L.P.

(57) ABSTRACT

In one embodiment, a semiconductor device includes a substrate, transistors on the substrate, and a stacked film provided above the transistors, including electrode layers separated from each other in a first direction, and including first, second and third regions. The device further includes plugs provided to the electrode layers in the first region, a first columnar portion in the second region, and a second columnar portion in the third region. At least one electrode layer among the electrode layers includes a first portion in the first region, a second portion in the second region, and a third portion in the third region, and is a continuous film from the second portion to the third portion via the first portion. The transistors include first, second and third transistors provided right under the first, second and third regions and electrically connected to first, second and third plugs among the plugs, respectively.

3 Claims, 28 Drawing Sheets

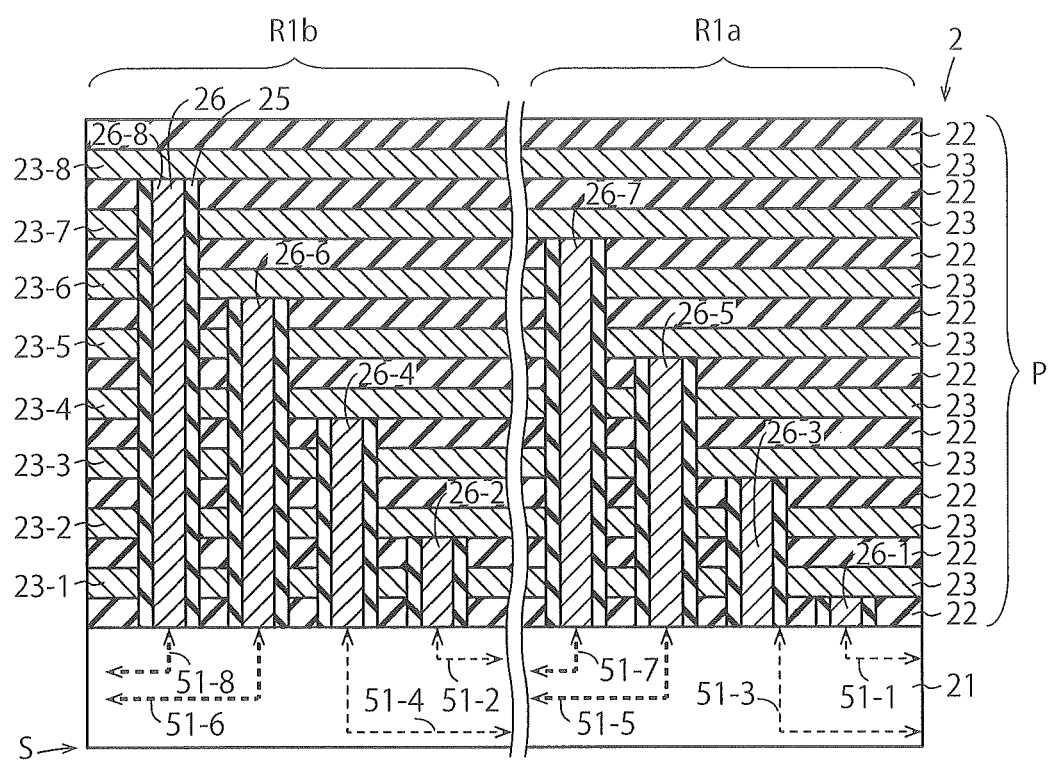
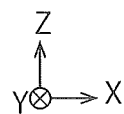
FIG. 12

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-131344, filed on Aug. 11, 2021, the entire contents of which are incorporated herein by reference.

FIELD

Embodiments described herein relate to a semiconductor device and a method of manufacturing the same.

BACKGROUND

When layout of interconnections in a semiconductor device is designed, it is preferable to reduce the density of these interconnections.

BRIEF DESCRIPTION OF THE DRAWINGS

FIG. 12 is a cross-sectional diagram illustrating the structure of the semiconductor device of the third modified example of the first embodiment;

DETAILED DESCRIPTION

Figure 1:
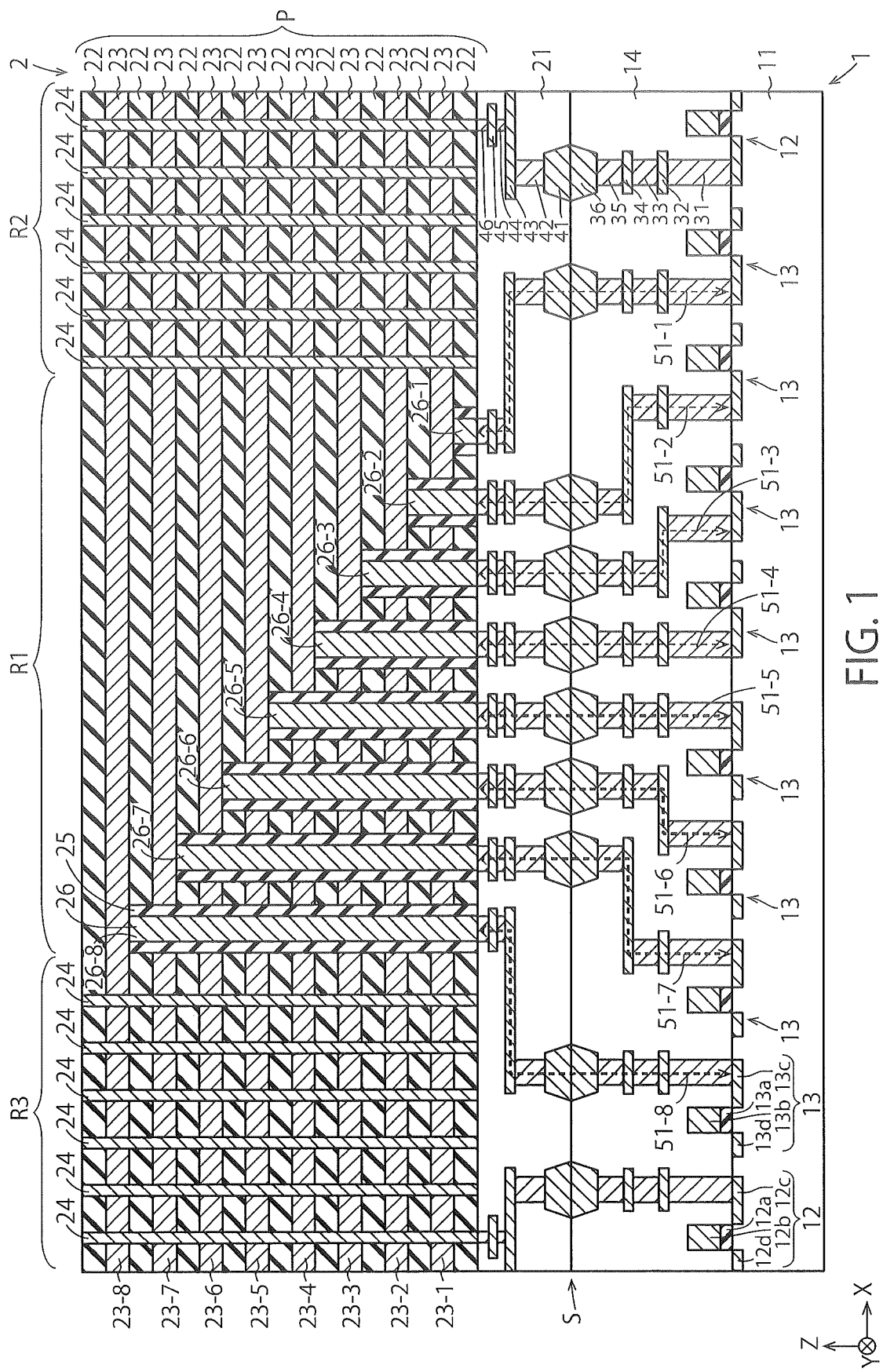
FIG. 1 is a cross-sectional diagram illustrating a structure of a semiconductor device of a first embodiment.

Embodiments will now be explained with reference to the accompanying drawings. In FIGS. 1 to 28B, the same reference numerals will be assigned to the same components and overlapping explanation will be omitted.

In one embodiment, a semiconductor device includes a substrate, a plurality of transistors provided on the substrate, and a stacked film provided above the plurality of transistors, including a plurality of electrode layers separated from each other in a first direction, and including a first region, a second region located on a side of a second direction with respect to the first region, and a third region located on an opposite side of the second direction with respect to the first region, the second direction intersecting the first direction. The device further includes a plurality of plugs respectively provided to the plurality of electrode layers in the first region, a first columnar portion provided in the second region, and including a first semiconductor layer extending in the first direction and a first charge storage layer provided between the first semiconductor layer and the plurality of electrode layers, and a second columnar portion provided in the third region, and including a second semiconductor layer extending in the first direction and a second charge storage layer provided between the second semiconductor layer and the plurality of electrode layers. At least one electrode layer among the plurality of electrode layers includes a first portion included in the first region, a second portion included in the second region, and a third portion included in the third region, and is a continuous film from the second portion to the third portion via the first portion. The plurality of transistors include a first transistor provided right under the first region and electrically connected to a first plug among the plurality of plugs, a second transistor provided right under the second region and electrically connected to a second plug among the plurality of plugs, and a third transistor provided right under the third region and electrically connected to a third plug among the plurality of plugs.

FIRST EMBODIMENT

FIG. 1 is a cross-sectional diagram illustrating a structure of a semiconductor device of a first embodiment.

The semiconductor device in FIG. 1 is, for example, a three-dimensional semiconductor memory. This semiconductor device includes a circuit portion 1 and an array portion 2 provided on the circuit portion 1. The array portion 2 includes a memory cell array including a plurality of memory cells, and the circuit portion 1 includes a CMOS circuit which controls the memory cell array. This semiconductor device is, for example, manufactured by bonding a circuit wafer including the circuit portion 1 and an array wafer including the array portion 2 together. FIG. 1 illustrates a surface S where the circuit portion 1 (circuit wafer) and the array portion 2 (array wafer) are bonded together.

FIG. 1 illustrates an X direction, a Y direction and a Z direction which are perpendicular to each other. In this specification, +Z direction is dealt with as an upward direction, −Z direction is dealt with as a downward direction. The −Z direction may match a gravity direction or does not have to match the gravity direction. The Z direction is an example of a first direction, the X direction is an example of a second direction which intersects the first direction, and the Y direction is an example of a third direction which intersects the first and the second directions.

The circuit portion 1 includes a substrate 11, a plurality of transistors 12, a plurality of transistors 13, and an inter layer dielectric 14. The array portion 2 includes an inter layer dielectric 21, a plurality of insulators 22, a plurality of electrode layers 23, a plurality of columnar portions 24, a plurality of insulators 25, and a plurality of contact plugs 26. Each transistor 12 includes a gate insulator 12a, a gate electrode 12b, a diffusion layer 12c and a diffusion layer 12d, and each transistor 13 includes a gate insulator 13a, a gate electrode 13b, a diffusion layer 13c, and a diffusion layer 13d. FIG. 1 further illustrates a stacked film P which alternately includes the plurality of insulators 22 and the plurality of electrode layers 23.

The circuit portion 1 further includes a plurality of contact plugs 31, an interconnection layer 32, a plurality of via plugs 33, an interconnection layer 34, a plurality of via plugs 35, and a plurality of metal pads 36. The array portion 2 further includes a plurality of metal pads 41, a plurality of via plugs 42, an interconnection layer 43, a plurality of via plugs 44, an interconnection layer 45, and a plurality of via plugs 46. Each of the interconnection layers 32, 34, 43 and 45 includes a plurality of interconnections.

The substrate 11 is, for example, a semiconductor substrate such as a silicon substrate. In FIG. 1, an upper surface of the substrate 11 is parallel to the X direction and the Y direction and is perpendicular to the Z direction. FIG. 1 illustrates regions R1, R2 and R3 on the substrate 11.

Each of the regions R1, R2 and R3 includes the inter layer dielectric 14 on the substrate 11, the inter layer dielectric 21, and the stacked film P. The region R1 further includes the contact plugs 26, or the like, provided in the stacked film P. The stacked film P in the region R1 corresponds to a hookup portion in the semiconductor device of the present embodiment. Meanwhile, the regions R2 and R3 further include the columnar portions 24, or the like, provided in the stacked film P. The stacked film P in the regions R2 and R3 corresponds to a memory cell array portion in the semiconductor device of the present embodiment. The region R1 is located between the region R2 and the region R3. The region R2 is located on a side of the +X direction with respect to the region R1. The region R3 is located on a side of −X direction with respect to the region R1. The region R1 in the stacked film P is an example of a first region, the region R2 in the stacked film P is an example of a second region, and the region R3 in the stacked film P is an example of a third region. The side of the +X direction is an example of a side of the second direction, the side of the −X direction is an example of an opposite side of the second direction.

The transistor 12 is provided on the substrate 11. The gate insulator 12a and the gate electrode 12b of each transistor 12 are sequentially stacked on the substrate 11. The diffusion layer 12c and the diffusion layer 12d of each transistor 12 are formed in the substrate 11 so that the gate electrode 12b is put between the diffusion layer 12c and the diffusion layer 12d. One of the diffusion layer 12c and the diffusion layer 12d functions as a source region, and the other of the diffusion layer 12c and the diffusion layer 12d functions as a drain region. Each transistor 12 is electrically connected to the corresponding columnar portion 24 via the metal pads 36, 41, or the like. As illustrated in FIG. 1, the transistor 12 in the present embodiment is provided only in the regions R2 and R3 among the regions R1, R2 and R3.

The transistor 13 is provided on the substrate 11. The gate insulator 13a and the gate electrode 13b of each transistor 13 are sequentially stacked on the substrate 11. The diffusion layer 13c and the diffusion layer 13d of each transistor 13 are formed in the substrate 11 so that the gate electrode 13b is put between the diffusion layer 13c and the diffusion layer 13d. One of the diffusion layer 13c and the diffusion layer 13d functions as a source region, and the other of the diffusion layer 13c and the diffusion layer 13d functions as a drain region. Each transistor 13 is electrically connected to the corresponding contact plug 26 via the metal pads 36, 41, or the like. As illustrated in FIG. 1, the transistor 13 in the present embodiment is also provided in the regions R2 and R3 as well as in the region R1. The transistors 13 in the region R1 are examples of a first transistor right under the first region, the transistors 13 in the region R2 are examples of a second transistor right under the second region, and the transistors 13 in the region R3 are examples of a third transistor right under the third region.

The inter layer dielectric 14 is provided on the substrate 11 and covers the transistor 12 and the transistor 13. The inter layer dielectric 14 is, for example, a stacked film including a silicon oxide film and other insulators.

The inter layer dielectric 21 is provided on the inter layer dielectric 14 and is put between the inter layer dielectric 14 and the stacked film P. The inter layer dielectric 21 is, for example, a stacked film including a silicon oxide film and other insulators. The above-described plurality of insulators 22 and the above-described plurality of electrode layers 23 are alternately stacked on the inter layer dielectric 21 above the substrate 11 to form the stacked film P. These electrode layers 23 are separated (isolated) from each other in the Z direction. Each insulator 22 is, for example, a silicon oxide film. Each electrode layer 23 is, for example, a metal layer including a tungsten (W) layer. Each electrode layer 23, for example, functions as a word line.

FIG. 1 illustrates eight electrode layers 23-1 to 23-8 as examples of the above-described plurality of electrode layers 23. The stacked film P sequentially includes the electrode layers 23-1 to 23-8 in the Z direction. The electrode layers 23-1 to 23-8 are examples of the first to the N-th electrode layers (N is an integer equal to or greater than 2). While a value of N is 8 in the present embodiment, the value of N may be an integer other than 8.

Each electrode layer 23 of the present embodiment includes a portion included in the region R1, a portion included in the region R2, and a portion included in the region R3, and is a continuous film which is continuously provided in these three portions. In other words, each electrode layer 23 of the present embodiment continuously extends from the region R3 to the region R2 via the region R1 in the X direction and is a continuous film from the region R3 to the region R2 via the region R1. The portion included in the region R1 is an example of a first portion, the portion included in the region R2 is an example of a second portion, and the portion included in the region R3 is an example of a third portion. The above-described plurality of electrode layers 23 may include an electrode layer 23 which does not correspond to such a continuous film.

The columnar portions 24 are provided in the stacked film P in the regions R2 and R3. Each columnar portion 24 has a columnar shape extending in the Z direction and penetrates (pierces) through the electrode layers 23-1 to 23-8. As will be described later, each columnar portion 24 includes a charge storage layer and a channel semiconductor layer. The channel semiconductor layer in each columnar portion 24 is electrically connected to the corresponding transistor 12. The columnar portion 24 in the region R2 is an example of a first columnar portion, and the columnar portion 24 in the region R3 is an example of a second columnar portion.

The insulators 25 and the contact plugs 26 are provided in the stacked film P in the region R1. Each insulator 25 is, for example, a silicon oxide film. Each contact plug 26 is, for example, a polysilicon layer or a metal layer. Each contact plug 26 is provided in the stacked film P via the insulator 25 and is electrically connected to the corresponding electrode layer 23. Further, each contact plug 26 is electrically connected to the corresponding transistor 13.

FIG. 1 illustrates eight contact plugs 26-1 to 26-8 as examples of the contact plugs 26. The contact plugs 26-1 to 26-8 illustrated in FIG. 1 are sequentially arranged in the X direction. The contact plugs 26-1 to 26-8 respectively extend from a lower surface of the stacked film P to lower surfaces of the electrode layers 23-1 to 23-8 and are electrically connected to the electrode layers 23-1 to 23-8. As a result, a contact plug 26-K (K is an integer which satisfies 2≤K≤8) penetrates through the electrode layers 23-1 to 23-(K−1) and is in contact with an electrode layer 23-K. For example, the contact plug 26-6 penetrates through the electrode layers 23-1 to 23-5 and is in contact with the electrode layer 23-6. The contact plugs 26-1 to 26-8 are examples of the first to the N-th connection plugs. Further, the contact plug 26-K is an example of the K-th connection plug, and the electrode layer 23-K is an example of the K-th electrode layer.

FIG. 1 illustrates the contact plugs 31, the interconnection layer 32, the via plugs 33, the interconnection layer 34, the via plugs 35, the metal pads 36, the via plugs 42, the interconnection layer 43, the via plugs 44, the interconnection layer 45 and the via plugs 46 sequentially provided on the substrate 11. While each contact plug 31 is electrically connected to the diffusion layer 12c or 13c of the transistor 12 or 13 in FIG. 1, each contact plug 31 may be electrically connected to the gate electrode 12b or 13b of the transistor 12 or 13. Each metal pad 36 is bonded to the corresponding metal pad 41. Each via plug 46 is electrically connected to the corresponding columnar portion 24 or the contact plug 26.

As a result, each columnar portion 24 is electrically connected to the corresponding transistor 12 via these plugs, interconnection layer and pads. Meanwhile, each contact plug 26 is electrically connected to the corresponding transistor 13 via these plugs, interconnection layer and pads. The interconnection layer 45 includes an interconnection (bit line) which electrically connects each columnar portion 24 to the corresponding transistor 12. The bit line in the present embodiment extends in the Y direction.

FIG. 1 indicates interconnections 51-1 to 51-8 which respectively electrically connect the contact plugs 26-1 to 26-8 to the transistors 13 with dashed lines. The interconnections 51-1 to 51-8 are formed with the contact plugs 31, the interconnection layer 32, the via plugs 33, the interconnection layer 34, the via plugs 35, the metal pads 36, the metal pads 41, the via plugs 42, the interconnection layer 43, the via plugs 44, the interconnection layer 45 and the via plugs 46. Each of the interconnections 51-1 to 51-8 therefore includes at least one pair of metal pads 36 and 41. These metal pads 36 and 41 are in contact with each other and electrically connect the circuit portion 1 to the array portion 2.

The interconnections 51-1 to 51-8 of the present embodiment are respectively located on a side of the region R2 or on a side of the region R3 with respect to the contact plugs 26-1 to 26-8. For example, the interconnection 51-1 is located on the side of the region R2 with respect to the contact plug 26-1, extends from the region R1 toward the region R2 and reaches the region R2. As a result, the interconnection 51-1 is electrically connected to the transistor 13 provided in the region R2. Meanwhile, the interconnection 51-8 is located on the side of the region R3 with respect to the contact plug 26-8, extends from the region R1 toward the region R3 and reaches the region R3. As a result, the interconnection 51-8 is electrically connected to the transistor 13 provided in the region R3. The contact plugs 26 electrically connected to the transistors 13 in the regions R1, R2 and R3 are respectively examples of first, second and third plugs.

In the present embodiment, an interconnection 51-K1 (K1 is an integer which satisfies 1<K1≤4) is located on the side of the region R2 with respect to a contact plug 26-K1, and an interconnection 51-K2 (K2 is an integer which satisfies 4<K2≤8) is located on the side of the region R3 with respect to the contact plug 26-K2. For example, the interconnection 51-3 is located on a side of the region R2 with respect to the contact plug 26-5 and extends to a right side of the contact plug 26-3. Meanwhile, the interconnection 51-6 is located on a side of the region R3 with respect to the contact plug 26-6 and extends to a left side of the contact plug 26-6. Both the interconnection 51-3 and the interconnection 51-6 are electrically connected to the transistors 13 provided in the region R1. The interconnection 51-K1 is an example of the K1-th interconnection, and the contact plug 26-K1 is an example of the K1-th connection plug. Further, the interconnection 51-K1 is an example of the K2-th interconnection, and the contact plug 26-K2 is an example of the K2-th connection plug.

The interconnection 51-K1 may be located right under the contact plug 26-K1 as the interconnection 51-4 which is located right under the contact plug 26-4. In a similar manner, the interconnection 51-K2 may be located right under the contact plug 26-K2 as the interconnection 51-5 which is located right under the contact plug 26-5.

The present embodiment makes it possible to reduce density of, for example, the interconnections 51-1 to 51-8 in the semiconductor device by disposing the transistors 13 in the regions R2 and R3. This will be described in detail with reference to FIGS. 2 to 4.

While the contact plugs 26-1 to 26-8 are indicated on the same XZ cross-section in FIG. 1, the contact plugs 26-1 to 26-8 do not have to be provided on the same XZ cross-section. In a similar manner, while the interconnections 51-1 to 51-8 are indicated on the same XZ cross-section in FIG. 1, the interconnections 51-1 to 51-8 do not have to be provided on the same XZ cross-section. Actually, the interconnections 51-1 to 51-8 illustrated in FIG. 2 which will be described later are not provided on the same XZ cross-section. In a similar manner, while the transistors 13 which are electrically connected to the interconnections 51-1 to 51-8 are indicated on the same XZ cross-section in FIG. 1, the transistors 13 do not have to be provided on the same XZ cross-section.

Figure 2:
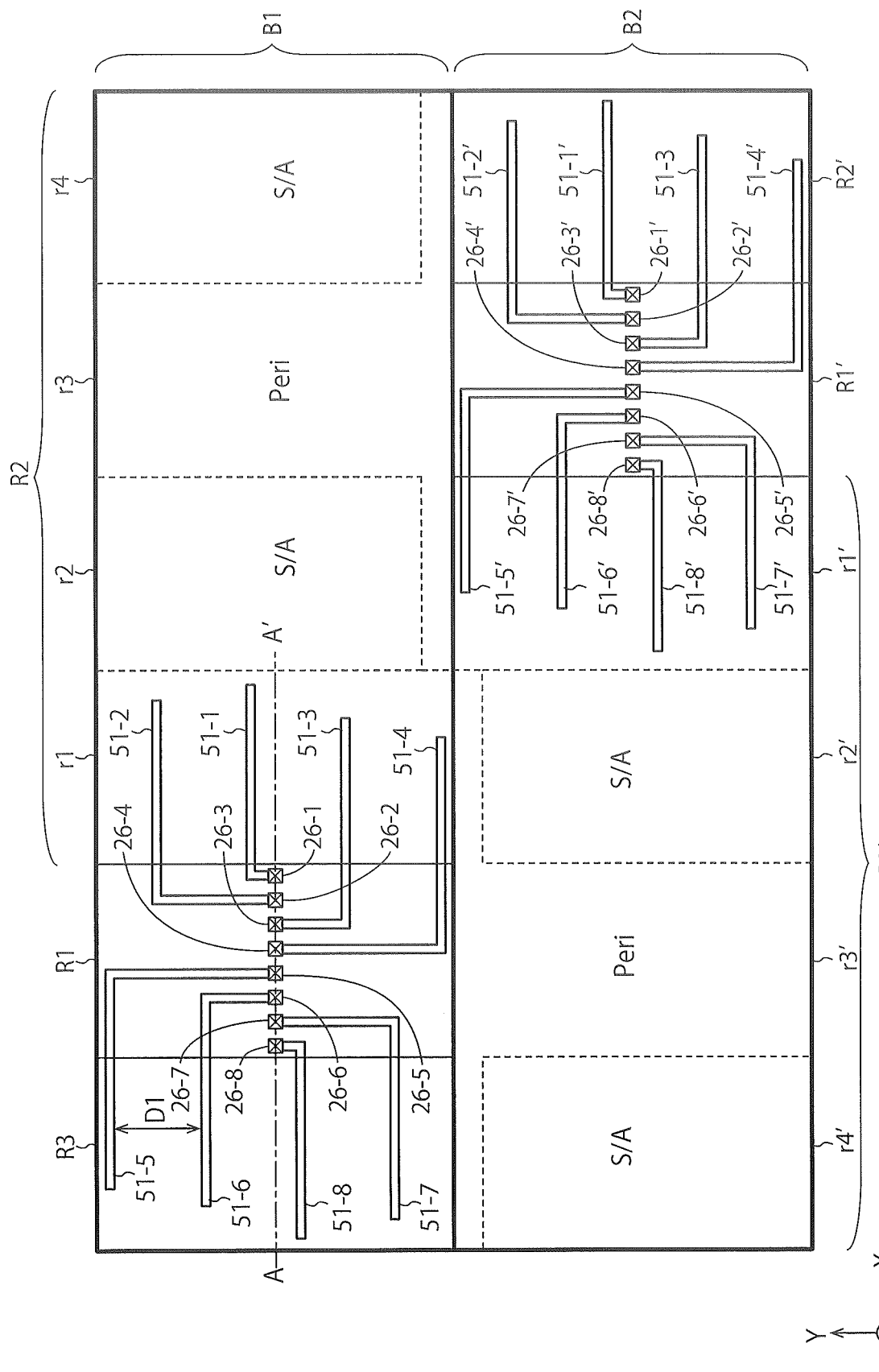
FIG. 2 is a plan view illustrating the structure of the semiconductor device of the first embodiment.

FIG. 2 is a plan view illustrating the structure of the semiconductor device of the first embodiment.

FIG. 2 illustrates the regions R1, R2 and R3 illustrated in FIG. 1. The region R2 is located in the +X direction of the region R1, and the region R3 is located in the −X direction of the region R1. Further, FIG. 2 illustrates regions r1, r2, r3 and r4 included in the region R2. The regions r1 to r4 are sequentially arranged in the +X direction. The regions r2 to r4, for example, include peripheral circuits of a three-dimensional semiconductor memory. In more detail, the regions r2 and r4 of the present embodiment include sense amplifiers (S/A) in the peripheral circuits, and the region r3 of the present embodiment includes other portions in the peripheral circuits. The regions R1 to R3 of the present embodiment form one block B1.

FIG. 2 further illustrate regions R1' to R3' having structures similar to the structures of the regions R1 to R3, and regions r1' to r4' having structures similar to the structures of the regions r1 to r4. The region R2' is located in the +X direction of the region R1', and the region R3' is located in the −X direction of the region R1'. The regions r1' to r4' are included in the region R3' and are sequentially arranged in the −X direction. The regions r2' to r4', for example, include peripheral circuits of a three-dimensional semiconductor memory. In more detail, the regions r2' and r4' of the present embodiment include sense amplifiers in the peripheral circuits in a similar manner to the regions r2 and r4, and the region r3' of the present embodiment includes other portions in the peripheral circuits in a similar manner to the region r3. The regions R1' to R3' of the present embodiment form one block B2.

Each electrode layer 23 in the block B2 is divided from the corresponding electrode layer 23 in the block B1 by a slit between the block B1 and the block B2. Meanwhile, each bit line in the interconnection layer 45 is provided in the block B1 and the block B2 on any one of the sense amplifiers and is electrically connected to the sense amplifier.

The region r3 of the present embodiment has a T-shape and includes a portion put between the region r2 and the region r4, a portion put between the region r2 and the region r1', and a portion put between the region r4 and the region R2'. In a similar manner, the region r3' of the present embodiment has a T-shape and includes a portion put between the region r2' and the region r4', a portion put between the region r2' and the region r1, and a portion put between the region r4' and the region R3. As described above, the region R1 includes the contact plugs 26-1 to 26-8. The contact plugs 26-1 to 26-8 are respectively electrically connected to the interconnections 51-1 to 51-8. In FIG. 2, each of the interconnections 51-1 to 51-8 has a L-planar shape and has one bent portion in planar view. Each of these interconnections 51-1 to 51-8 may have a more complicated planar shape and, for example, may have two or more bent portions in planar view. FIG. 1 illustrates an XZ cross-section along a line A-A' illustrated in FIG. 2.

As described above, the interconnections 51-1 to 51-8 of the present embodiment are respectively located on the side of the region R2 or on the side of the region R3 with respect to the contact plugs 26-1 to 26-8. For example, the interconnections 51-1, 51-2, 51-3 and 51-4 are respectively located on the side of the region R2 with respect to the contact plugs 26-1, 26-2, 26-3 and 26-4 and extend from the region R1 toward the region R2. Meanwhile, the interconnections 51-5, 51-6, 51-7 and 51-8 are respectively located on the side of the region R3 with respect to the contact plugs 26-5, 26-6, 26-7 and 26-8 and extend from the region R1 toward the region R3. For example, the transistors 13 for the interconnections 51-1 to 51-8 are respectively disposed around tips of the interconnections 51-1 to 51-8 in the region R2 or the region R3.

Hereinafter, each of the interconnections 51-1 to 51-8 will be also expressed as an interconnection 51. FIG. 2 indicates a distance D1 between the interconnections 51 adjacent to each other in the Y direction in the region R2 or the region R3 of the present embodiment. The present embodiment makes it possible to make the distance D1 longer by reducing density of the interconnections 51 in the semiconductor device.

While all of the interconnections 51-1, 51-2, 51-3 and 51-4 illustrated in FIG. 2 reach the region R2, part of the interconnections 51-1, 51-2, 51-3 and 51-4 does not have to reach the region R2. For example, the interconnections 51-2, 51-3 and 51-4 illustrated in FIG. 1 do not reach the region R2 and only the interconnection 51-1 reaches the region R2. Further, part of the interconnections 51-1, 51-2, 51-3 and 51-4 does not have to be located on the side of the region R2 with respect to the contact plugs 26-1, 26-2, 26-3 and 26-4. For example, at least one of the interconnections 51-2, 51-3 and 51-4 may have a planar shape linearly extending in the Y direction. The transistor 13 for the interconnection 51 may be disposed near the tip of the interconnection 51 in the region R1. The tips of the interconnections 51-1, 51-2, 51-3 and 51-4 illustrated in FIG. 2 are located in the region r1 of the region R2.

In a similar manner, while all of the interconnections 51-1, 51-6, 51-7 and 51-8 illustrated in FIG. 2 reach the region R3, part of the interconnections 51-5, 51-6, 51-7 and 51-8 does not have to reach the region R3. For example, the interconnections 51-5, 51-6 and 51-7 illustrated in FIG. 1 do not reach the region R3 and only the interconnection 51-8 reaches the region R3. Further, part of the interconnections 51-5, 51-6, 51-7 and 51-8 does not have to be located on the side of the region R3 with respect to the contact plugs 26-5, 26-6, 26-7 and 26-8. For example, at least one of the interconnections 51-5, 51-6 and 51-7 may have a planar shape linearly extending in the Y direction. The transistor 13 for the interconnection 51 may be disposed near the tip of the interconnection 51 in the region R1.

FIG. 2 further illustrates contact plugs 26-1' to 26-8' in the region R1' and interconnections 51-1' to 51-8' which are respectively electrically connected to the contact plugs 26-1' to 26-8'. Structures of the contact plugs 26-1' to 26-8' are respectively similar to the structures of the contact plugs 26-1 to 26-8. Structures of the interconnections 51-1' to 51-8' are respectively similar to the structures of the interconnections 51-1 to 51-8. For example, lengths in the Z direction of the contact plugs 26-1' to 26-8' are respectively the same as the lengths in the Z direction of the contact plugs 26-1 to 26-8. Further, the contact plugs 26-1' to 26-8' are respectively electrically connected to eight electrode layers 23 provided at the same heights as heights of the eight electrode layers 23-1 to 23-8.

As described above, the respective electrode layers 23 in the regions R1 to R3 of the present embodiment continuously extend in the X direction from the region R3 to the region R2 via the region R1 (see FIG. 1). The respective electrode layers 23 in the regions R1 to R3 of the present embodiment further continuously extend in the X direction from the region r1 to the region r4 via the regions r2 and r3. In a similar manner, the respective electrode layers 23 in the regions R1' to R3' of the present embodiment continuously extend in the −X direction from the region R2' to the region r4' via the regions R1', r1', r2' and r3'.

Figure 22:
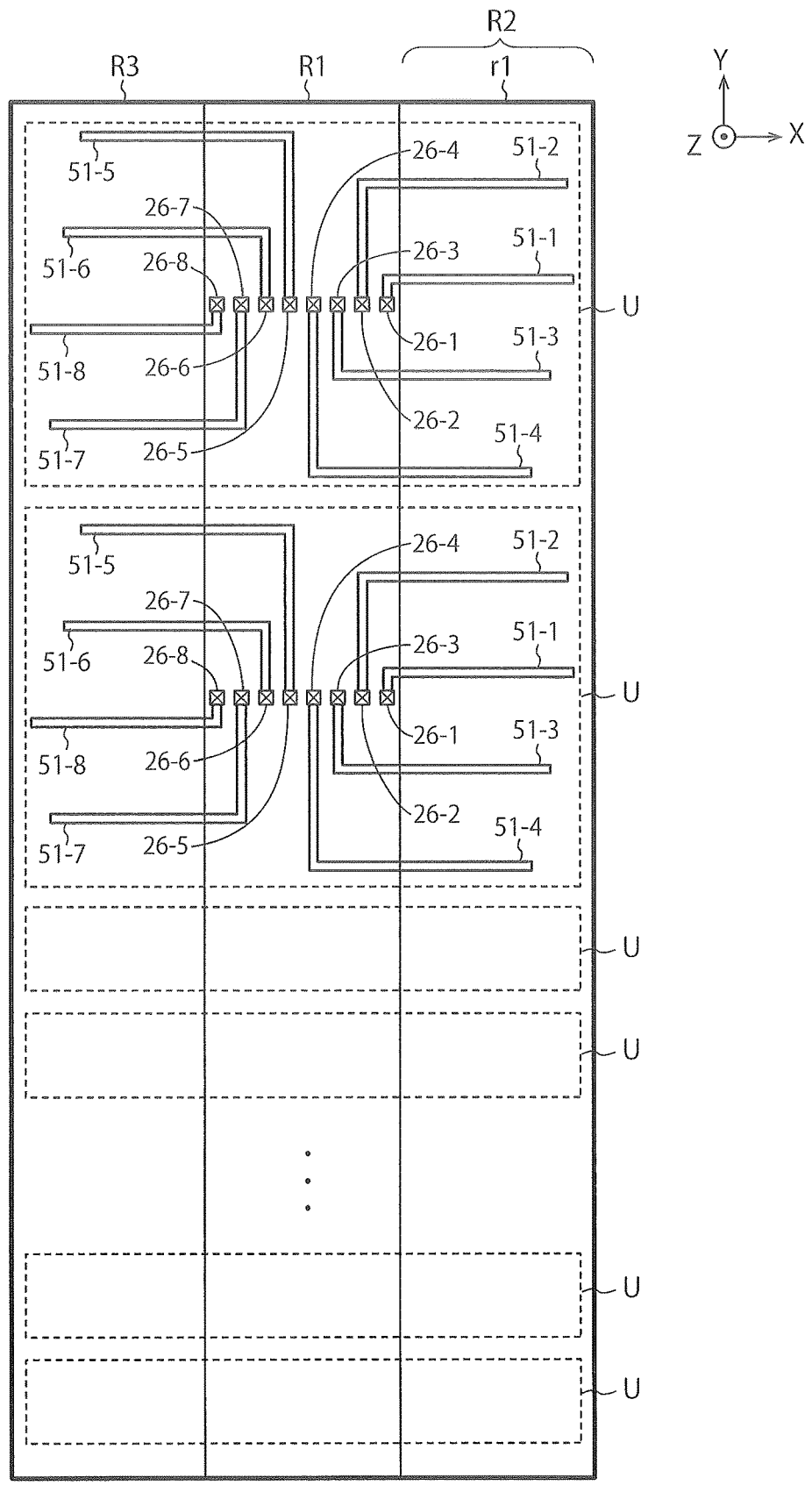
FIG. 22 is a plan view illustrating details of regions R1 to R3 illustrated in FIG. 2.

FIG. 22 is a plan view illustrating details of the regions R1 to R3 illustrated in FIG. 2.

As illustrated in FIG. 22, the regions R1 to R3 of the present embodiment include a plurality of units U extending in the X direction. These units U are adjacent to each other in the Y direction. Each of these units U includes the contact plugs 26-1 to 26-8 and the interconnections 51-1 to 51-8 illustrated in FIG. 2. In other words, FIG. 2 illustrates one unit among the plurality of units U included in the regions R1 to R3. Each unit U, for example, corresponds to one block of the three-dimensional semiconductor memory.

The regions R1' to R3' of the present embodiment also include a plurality of units U in a similar manner to the regions R1 to R3. However, each unit U of the regions R1' to R3' includes the contact plugs 26-1' to 26-8' and the interconnections 51-1' to 51-8' illustrated in FIG. 2. Further, each of the semiconductor devices illustrated in FIG. 4, FIG. 8, FIG. 9, FIG. 11, FIG. 13 and FIG. 14 which will be described later also includes a plurality of units U in a similar manner.

Figure 23:
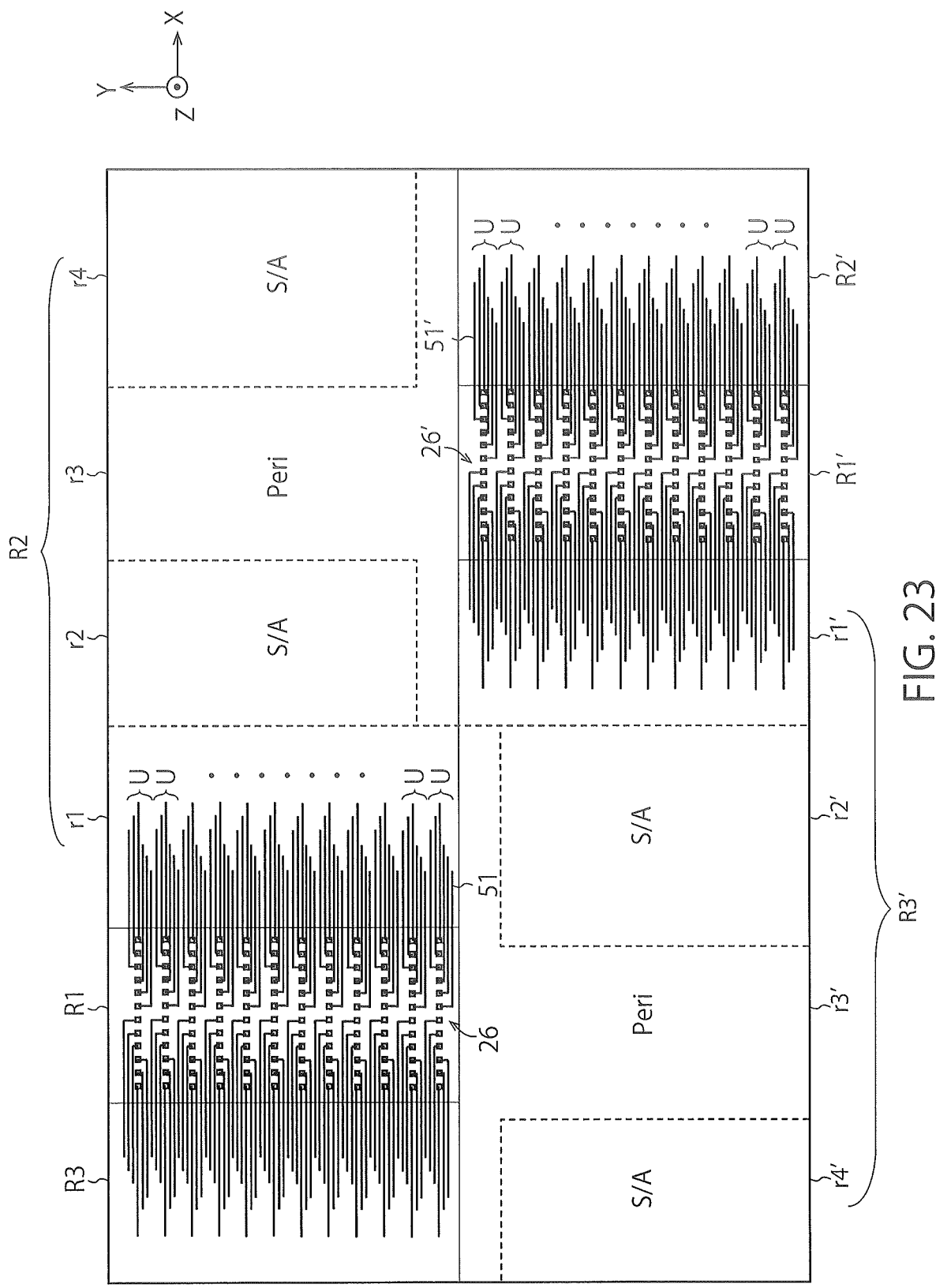
FIG. 23 is another plan view illustrating details of the regions R1 to R3 and the like illustrated in FIG. 2.

FIG. 23 is another plan view illustrating details of the regions R1 to R3 and the like illustrated in FIG. 2.

FIG. 23 illustrates an example of 12 units U included in the regions R1 to R3 and 12 units U included in the regions R1' to R3'. However, each unit U illustrated in FIG. 23 includes 12 contact plugs 26 (or 26') and 12 interconnections 51 (or 51'). The units U in the regions R1 to R3 are adjacent to each other in the Y direction. In a similar manner, the units U in the regions R1' to R3' are adjacent to each other in the Y direction.

Figure 24:
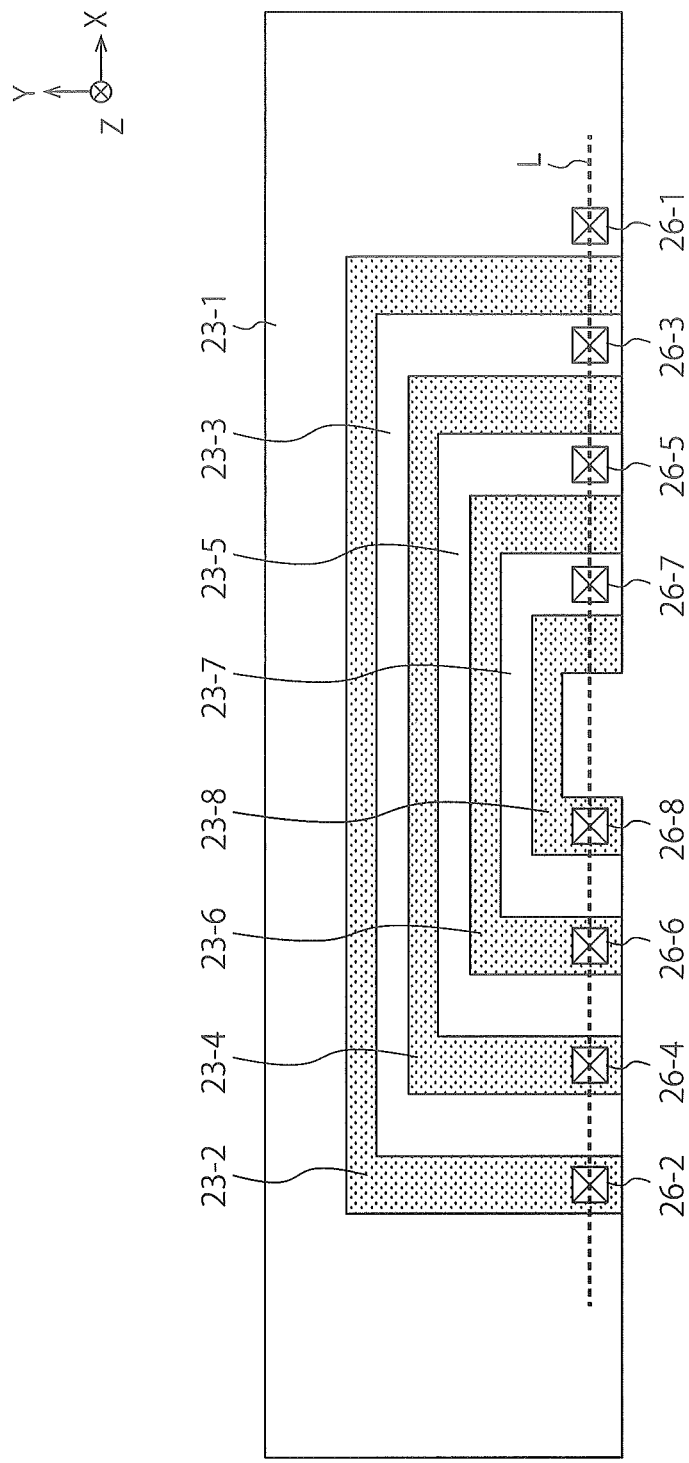
FIG. 24 is a plan view illustrating layout of electrode layers 23-1 to 23-8 and contact plugs 26-1 to 26-8 of the modified example of the first embodiment.

FIG. 24 is a plan view illustrating layout of the electrode layers 23-1 to 23-8 and the contact plugs 26-1 to 26-8 of a modified example of the first embodiment. FIG. 24 illustrates aspect where the electrode layers 23-1 to 23-8 and the contact plugs 26-1 to 26-8 are viewed upward from the bottom.

The electrode layers 23-1 to 23-8 and the contact plugs 26-1 to 26-8 illustrated in FIG. 1 may be arranged in layout as in the modified example illustrated in FIG. 24. In FIG. 24, part of the lower surface of the electrode layer 23-8 is exposed from the electrode layer 23-7, and part of the lower surface of the electrode layer 23-7 is exposed from the electrode layer 23-6. Further, part of the lower surface of the electrode layer 23-6 is exposed from the electrode layer 23-5, and part of the lower surface of the electrode layer 23-5 is exposed from the electrode layer 23-4. Still further, part of the lower surface of the electrode layer 23-4 is exposed from the electrode layer 23-3, part of the lower surface of the electrode layer 23-3 is exposed from the electrode layer 23-2, and part of the lower surface of the electrode layer 23-2 is exposed from the electrode layer 23-1.

The contact plugs 26-8 to 26-2 are respectively disposed under exposed portions of the electrode layers 23-8 to 23-2. In a similar manner, the contact plug 26-1 is disposed under the electrode layer 23-1. As illustrated in FIG. 24, these contact plugs 26-1 to 26-8 are disposed along a line L extending in the X direction.

Figure 25A:
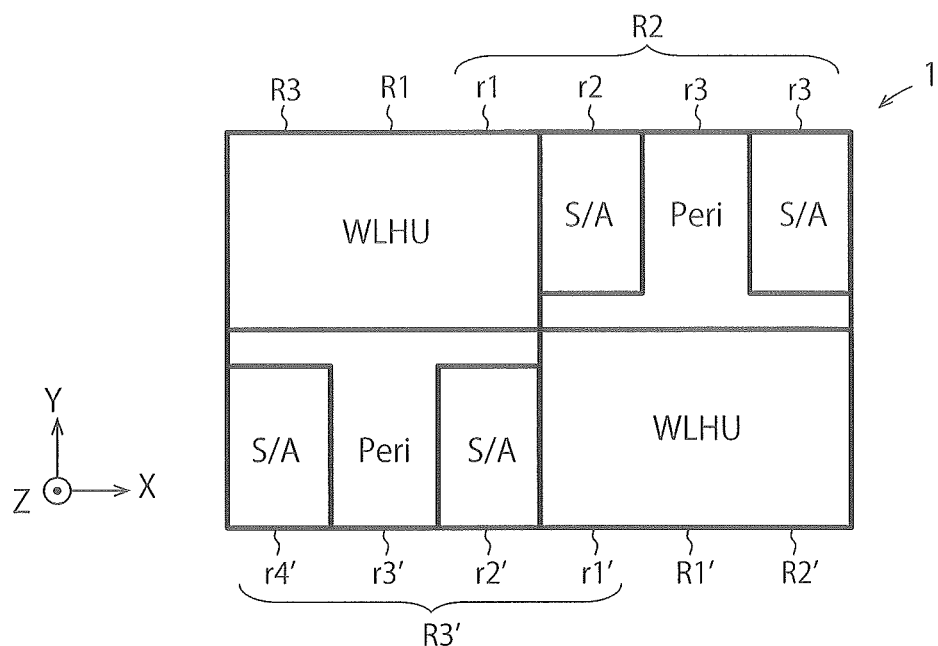
FIGS. 25A and 25B are plan views illustrating details of the semiconductor device illustrated in FIG. 2.
Figure 25B:
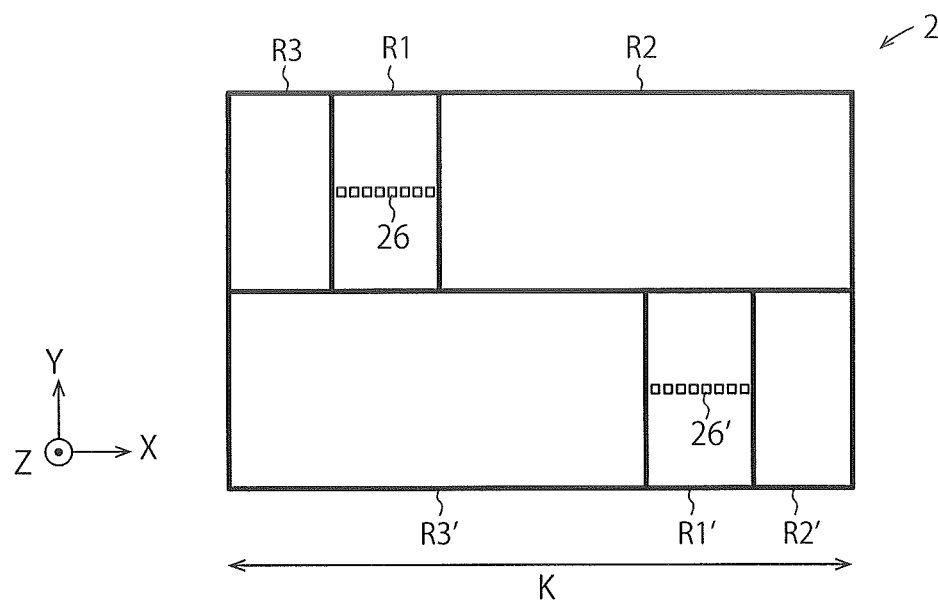

FIGS. 25A and 25B are plan views illustrating details of the semiconductor device illustrated in FIG. 2.

FIG. 25A illustrates a structure of the circuit portion 1. As described above, the regions r2, r4, r2' and r4' include sense amplifiers in the peripheral circuits, and the regions r3 and r3' include other portions in the peripheral circuits. Further, the circuit portion 1 includes a hookup region (WLHU) across the regions R1, R3 and r1, and a hookup region across the regions R1' R2' and r1'. The sense amplifiers include the above-described transistors 12, and the hookup regions include the above-described transistors 13 (see FIG. 1).

FIG. 25B illustrates a structure of the array portion 2. As described above, the region R1 includes the contact plugs 26, and the respective electrode layers 23 in the regions R1 to R3 continuously extend in the X direction in a range indicated by a reference numeral "K". In a similar manner, the region R1' includes the contact plugs 26', and the respective electrode layers 23 in the regions R1' to R3' continuously extend in the X direction in a range indicated by the reference numeral "K".

Figure 3:
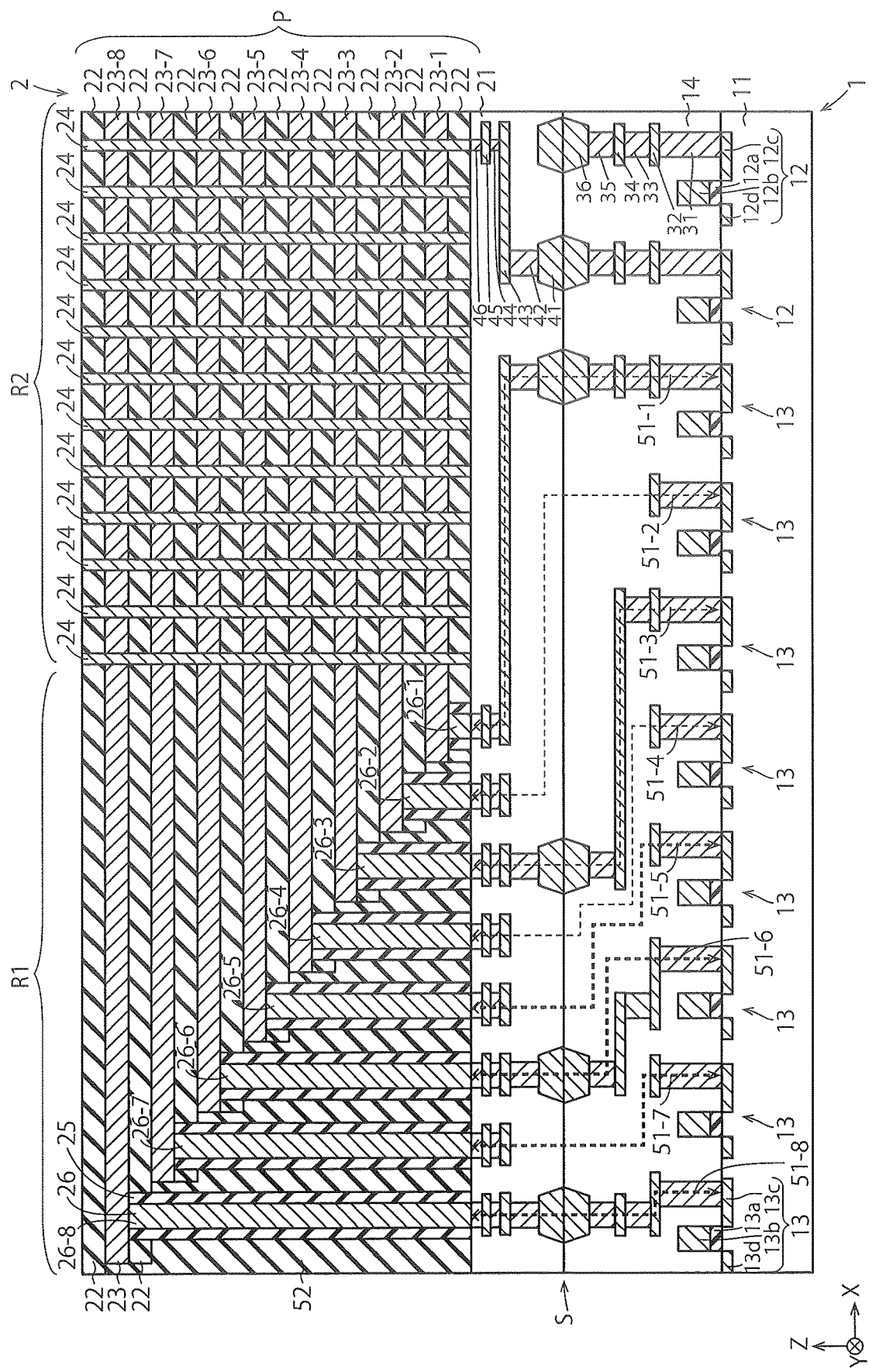
FIG. 3 is a cross-sectional diagram illustrating a structure of a semiconductor device of a comparative example of the first embodiment.

FIG. 3 is a cross-sectional diagram illustrating a structure of a semiconductor device of a comparative example of the first embodiment.

The semiconductor device (FIG. 3) of the present comparative example has a structure substantially similar to the structure of the semiconductor device (FIG. 1) of the first embodiment. However, the stacked film P of the present comparative example has a stepped structure in the region R1, and an inter layer dielectric 52 is provided under the stepped structure of the stacked film P. As a result, the contact plug 26-K (K is an integer which satisfies 2≤K≤8) of the present comparative example does not penetrate through the electrode layers 23-1 to 23-(K−1) and is in contact with the electrode layer 23-K. The contact plug 26-K of the present comparative example penetrates through the inter layer dielectric 52 in place of the electrode layers 23-1 to 23-(K−1).

The semiconductor device (FIG. 3) of the present comparative example includes the regions R1 and R2 but does not include the region R3. The transistors 12 of the present comparative example are therefore provided in the region R2 and not provided in the region R3. Further, the transistors 13 of the present comparative example are provided in the regions R1 and R2 and not provided in the region R3. Further, the interconnections 51-1 to 51-8 of the present comparative example are respectively located on the side of the region R2 with respect to the contact plugs 26-1 to 26-8. In FIG. 3, illustration of part of plugs, interconnection layers and pads which form the interconnections 51-2, 51-4, 51-5 and 51-7 is omitted to facilitate visualization of the drawings.

Figure 4:
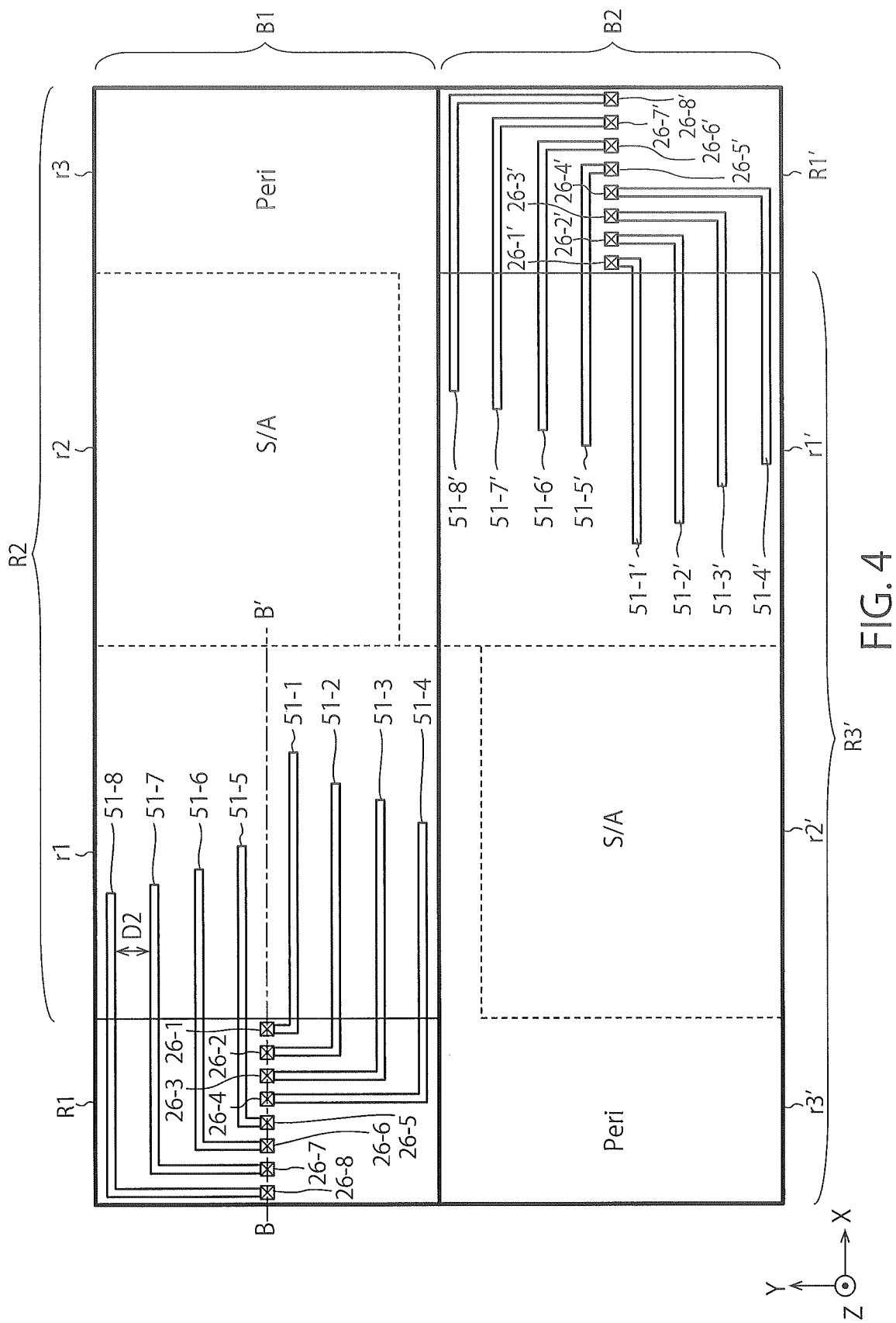
FIG. 4 is a plan view illustrating the structure of the semiconductor device of the comparative example of the first embodiment.

FIG. 4 is a plan view illustrating the structure of the semiconductor device of the comparative example of the first embodiment.

FIG. 4 illustrates the regions R1, R2, r1, r2 and r3 in a similar manner to FIG. 2 but does not illustrate the regions R3 and r4. Further, FIG. 4 illustrates the regions R1', R3', r1', r2' and r3' in a similar manner to FIG. 2 but does not illustrate the regions R2' and r4'. The semiconductor device of the present comparative example does not include the regions R3, r4, R2' and r4'. FIG. 3 illustrates an XZ cross-section along a line B-B' illustrated in FIG.

As described above, the interconnections 51-1 to 51-8 of the present comparative example are respectively located on the side of the region R2 with respect to the contact plugs 26-1 to 26-8. FIG. 4 indicates a distance D2 between the interconnections 51 adjacent to each other in the Y direction in the region R2 of the present comparative example. The distance D2 of the present comparative example is shorter than D1 in the first embodiment. Density of the interconnections 51 is therefore higher in the semiconductor device of the present comparative example.

All the interconnections 51-1 to 51-8 illustrated in FIG. 4 reach the region R2. The region R2 illustrated in FIG. 4 therefore includes eight interconnections 51, which results in making the distance D2 between the interconnections 51 in the region R2 shorter. Meanwhile, the interconnections 51-1 to 51-8 illustrated in FIG. 2 reach the region R2 or the region R3. The regions R2 and R3 illustrated in FIG. 2 therefore respectively include only four interconnections 51, which results in making the distance D1 between the interconnections 51 in the regions R2 and R3 longer.

In this manner, the present embodiment makes it possible to reduce density of the interconnections 51-1 to 51-8 in the semiconductor device by extending part of the interconnections 51-1 to 51-8 toward the region R2 and extending another part of the interconnections 51-1 to 51-8 toward the region R3. The distance D1 illustrated in FIG. 2 is approximately double the distance D2 illustrated in FIG. 4.

As described above, the interconnections 51-1 to 51-8 of the present embodiment may include interconnections 51 which reach neither the region R2 nor the region R3. In this case, the distance D1 between the interconnections 51 in the regions R2 and R3 can be further longer.

The same will also apply to the interconnections 51-1' to 51-8'. The present embodiment makes it possible to reduce density of the interconnections 51-1' to 51-8' in the semiconductor device by extending part of the interconnections 51-1' to 51-8' toward the region R2' and extending another part of the interconnections 51-1' to 51-8' toward the region R3'.

Figure 5:
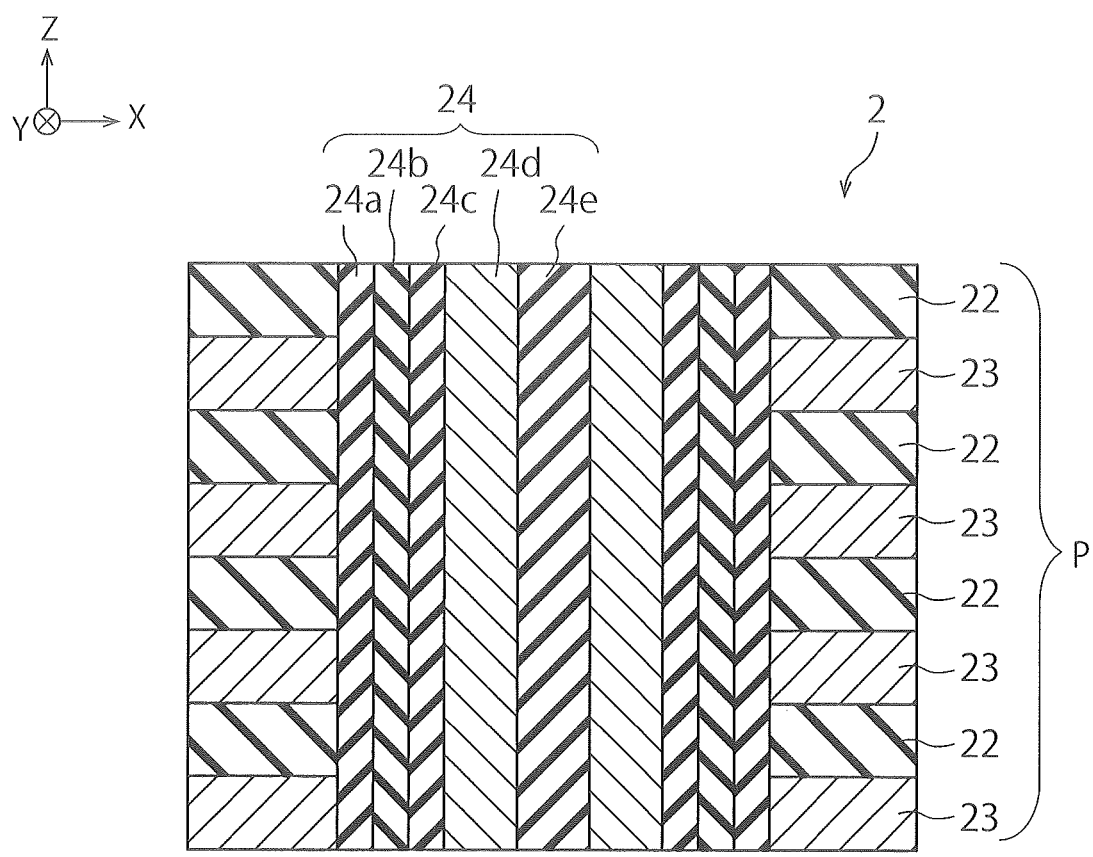
FIG. 5 is a cross-sectional diagram illustrating a structure of a columnar portion of the first embodiment.

FIG. 5 is a cross-sectional diagram illustrating a structure of the columnar portion 24 of the first embodiment.

Each columnar portion 24 (see FIG. 1) of the present embodiment has the structure illustrated in FIG. 5. The columnar portion 24 illustrated in FIG. 5 includes a block insulator 24a, a charge storage layer 24b, a tunnel insulator 24c, a channel semiconductor layer 24d and a core insulator 24e sequentially formed on a side surface of the stacked film P.

The block insulator 24a is, for example, a silicon oxide film. The charge storage layer 24b is, for example, an insulator such as a silicon nitride film. The charge storage layer 24b may be a semiconductor layer such as a polysilicon layer. The tunnel insulator 24c is, for example, a silicon oxide film. The channel semiconductor layer 24d is, for example, a polysilicon layer. The core insulator 24e is, for example, a silicon oxide film.

Figure 6:
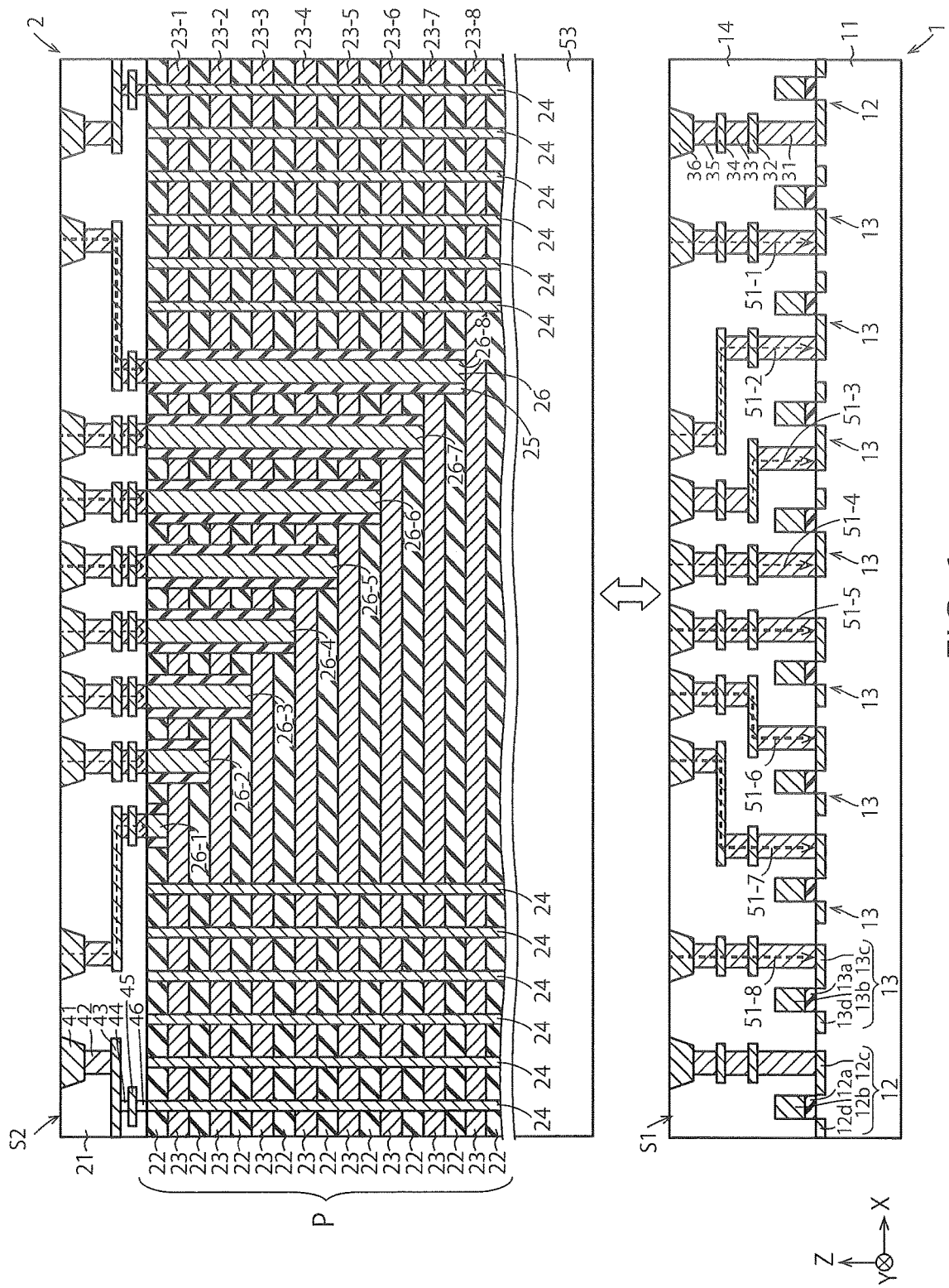
FIGS. 6 and 7 are cross-sectional diagrams illustrating a method of manufacturing the semiconductor device of the first embodiment.
Figure 7:
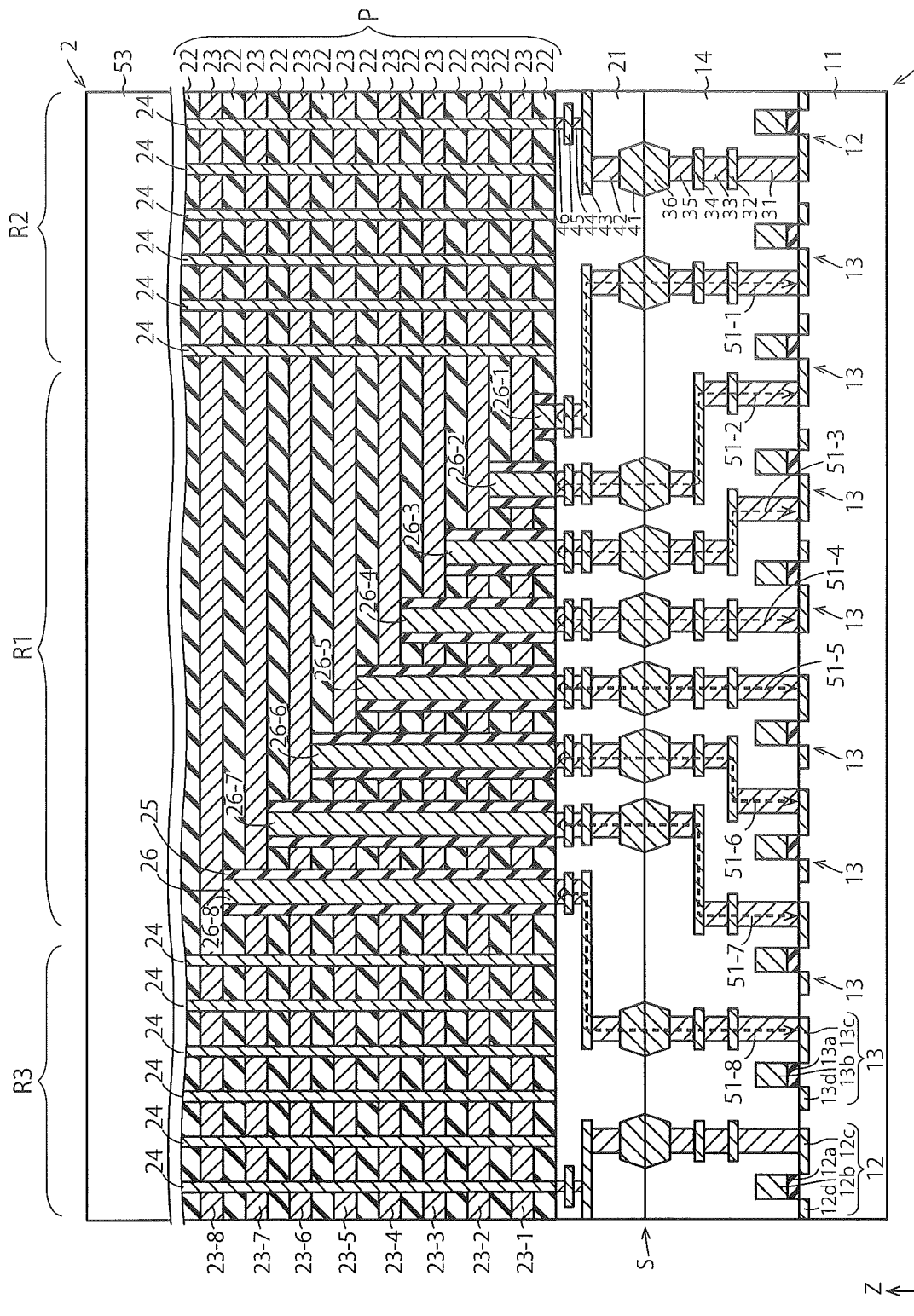

FIGS. 6 and 7 are cross-sectional diagrams illustrating a method of manufacturing the semiconductor device of the first embodiment.

FIG. 6 illustrates the circuit portion 1 included in the circuit wafer and the array portion 2 included in the array wafer. A direction of the array portion 2 illustrated in FIG. 6 is opposite to a direction of the array portion 2 illustrated in FIG. 1. As described above, the semiconductor device of the present embodiment is manufactured by bonding the circuit wafer and the array wafer together. FIG. 6 illustrates the array portion 2 before the direction is inverted for bonding, and FIG. 7 illustrates the array portion 2 which is bonded to the circuit portion 1 after the direction is inverted for bonding.

FIG. 6 illustrates an upper surface S1 of the circuit portion 1 and an upper surface S2 of the array portion 2. The array portion 2 illustrated in FIG. 6 includes a substrate 53 provided under the stacked film P. The substrate 53 is, for example, a semiconductor substrate such as a silicon substrate. The substrate 11 is an example of a first substrate, and the substrate 53 is an example of a second substrate.

The semiconductor device of the present embodiment is, for example, manufactured as follows. First, a plurality of transistors 12, a plurality of transistors 13, the inter layer dielectric 14, a plurality of contact plugs 31, the interconnection layer 32, a plurality of via plugs 33, the interconnection layer 34, a plurality of via plugs 35 and a plurality of metal pads 36 are formed on the substrate 11 (FIG. 6). Further, the inter layer dielectric 21, a plurality of insulators 22, a plurality of electrode layers 23, a plurality of columnar portions 24, a plurality of insulators 25, a plurality of contact plugs 26, a plurality of metal pads 41, a plurality of via plugs 42, the interconnection layer 43, a plurality of via plugs 44, the interconnection layer 45 and a plurality of via plugs 46 are formed on the substrate 53 (FIG. 6). Then, as illustrated in FIG. 7, the circuit wafer (circuit portion 1) and the array wafer (array portion 2) are bonded together by a mechanical pressure. By this means, the inter layer dielectric 14 is bonded to the inter layer dielectric 21. Then, the circuit wafer and the array wafer are annealed at 400° C. By this means, the metal pad 36 is bonded to the metal pad 41. The metal pads 36 and 41 are, for example, metal layers including a copper (CU) layer.

As a result, each columnar portion 24 is electrically connected to the corresponding transistor 12, and each contact plug 26 is electrically connected to the corresponding transistor 13 (FIG. 7). Further, the interconnections 51-1 to 51-8 are formed between the substrate 11 and the stacked film P (FIG. 7).

FIG. 7 illustrates the regions R1 to R3. Structures of the regions R1 to R3 illustrated in FIG. 7 are respectively the same as the structures of the regions R1 to R3 illustrated in FIG. 1. For example, the contact plugs 26 are provided in the region R1, and the columnar portions 24 are provided in the regions R2 and R3. Further, the transistors 12 are provided in the regions R2 and R3, and the transistors 13 are provided in the regions R1 to R3. Further, the interconnections 51-1 to 51-8 respectively extend to the right side or to the left side of the contact plugs 26-1 to 26-8.

Thereafter, the substrate 11 is made thinner through chemical mechanical polishing (CMP), and after the substrate 53 is removed through CMP, the circuit wafer and the array wafer are cut into a plurality of chips. The semiconductor device illustrated in FIG. 1 is manufactured in this manner.

While FIG. 1 illustrates a boundary surface of the inter layer dielectric 14 and the inter layer dielectric 21 and a boundary surface of the metal pad 36 and the metal pad 41, typically, these boundary surfaces are not observed after the above-described annealing. However, positions where these boundary surfaces exist can be estimated by detecting a tilt of the side surface of the metal pad 36, a tilt of the side surface of the metal pad 41 or displacement between the metal pad 36 and the metal pad 41.

Various modified examples of the first embodiment will be described next with reference to FIGS. 8 to 14. Differences from the first embodiment will be mainly described for these modified examples, and explanation of points which are in common with the first embodiment will be omitted as appropriate.

(1) First Modified Example

Figure 8:
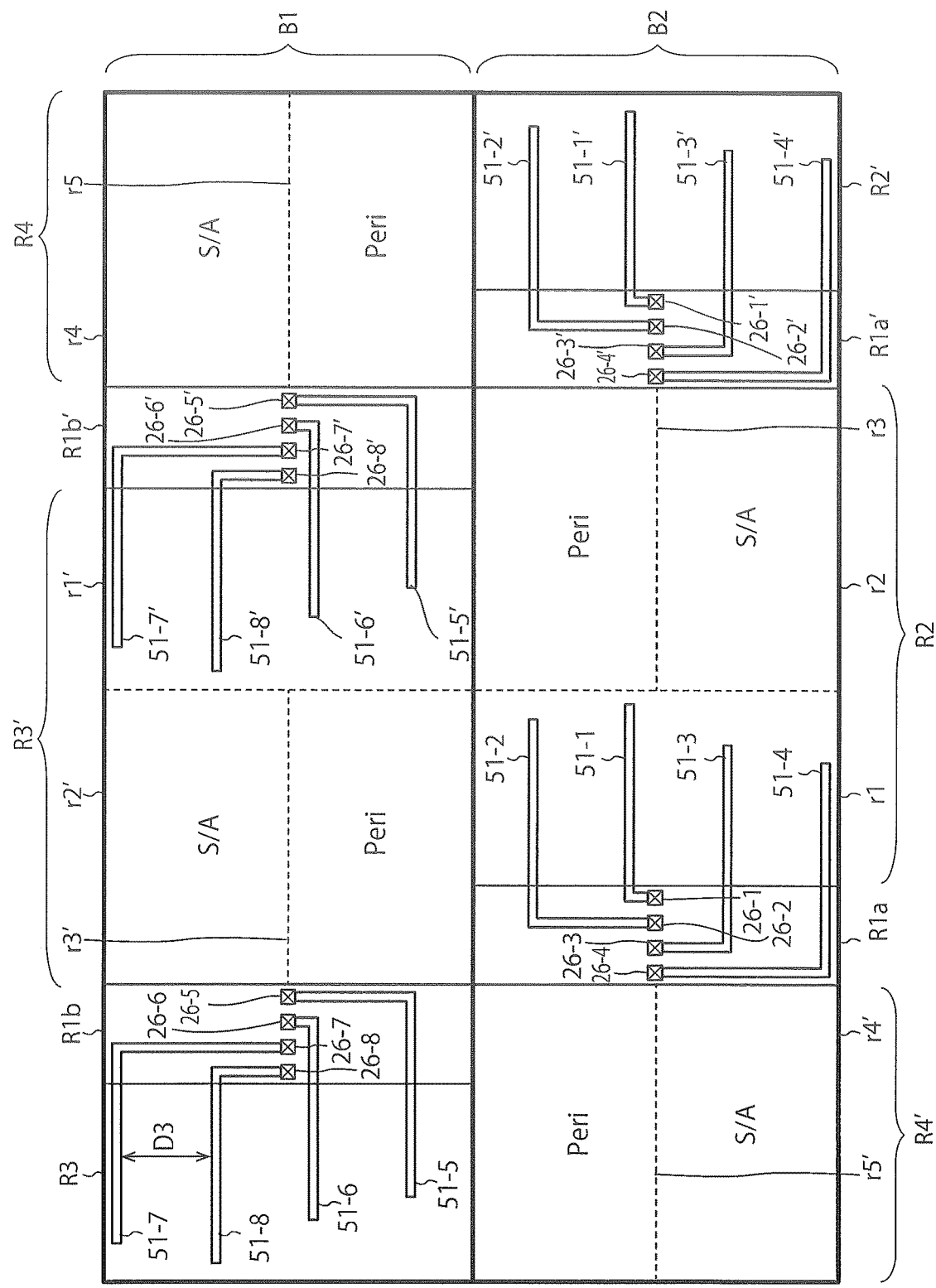
FIG. 8 is a plan view illustrating a structure of a semiconductor device of a first modified example of the first embodiment.

FIG. 8 is a plan view illustrating a structure of a semiconductor device of a first modified example of the first embodiment.

In the present modified example, the region R1 includes regions R1a and R1b which are separated from each other. The region R1a is an example of a first partial region, and the region R1b is an example of a second partial region. The region R2 is located in the +X direction of the region R1a, and the region R3 is located in the −X direction of the region R1b. The region R2 includes regions r1, r2 and r3. The region r1 is located in the +X direction of the region R1, the region r2 is located in the +X direction of the region r1, and the region r3 is located in the +X direction of the region r1 and in the +Y direction of the region r2. FIG. 8 further illustrates a region R4 located in the +X direction of the region R1b. The region R4 indicates a region r4 located in the +X direction of the region R1b and a region r5 located in the +X direction of the region R1b and in the −Y direction of the region r4.

The contact plugs 26-1 to 26-8 of the present modified example are provided in the regions R1a and R1b. Specifically, the contact plugs 26-1 to 26-4 are provided in the region R1a, and the contact plugs 26-5 to 26-8 are provided in the region R1b. The contact plugs 26-1 to 26-4 are examples of the Ka-th to the Kb-th connection plugs, and the contact plugs 26-5 to 26-8 are examples of the Kc-th to the Kd-th connection plugs (Ka, Kb, Kc and Kd are integers which satisfy 1≤Ka≤Kb<Kc≤Kd≤8). In the present modified example, Ka=1, Kb=4, Kc=5, and Kd=8.

The interconnections 51-1 to 51-8 of the present modified example are respectively located on the side of the region R2 or on the side of the region R3 with respect to the contact plugs 26-1 to 26-8. For example, the interconnections 51-1 to 51-4 are respectively located on the side of the region R2 with respect to the contact plugs 26-1 to 26-4 and extend from the region R1a toward the region R2. Further, the interconnections 51-5 to 51-8 are respectively located on the side of the region R3 with respect to the contact plugs 26-5 to 26-8 and extend from the region R1b toward the region R3.

FIG. 8 indicates a distance D3 between the interconnections 51 adjacent to each other in the Y direction in the region R2 or the region R3 of the present modified example. The interconnections 51-1 to 51-8 of the present modified example are located in the regions R2 and R3 in a similar manner to a case of the first embodiment. This makes it possible to make the distance D3 longer and makes it possible to reduce density of the interconnections 51 in the semiconductor device. The distance D3 illustrated in FIG. 8 is comparable with the distance D1 illustrated in FIG. 2.

In the present modified example, further, the region R1' includes regions R1a' and R1b' which are separated from each other, and the region R3' includes regions r1', r2' and r3'. Structures of the regions R1a', R1b', r1', r2' and r3' are respectively similar to the structures of the regions R1a, R1b, r1, r2 and r3. FIG. 8 further illustrates a region R4' located in the −X direction of the region R1a', and the region R4' includes regions r4' and r5'. Structures of the regions R4', r4' and r5' are respectively similar to the structures of the regions R4, r4 and r5. In the present modified example, the region R2 is located between the region R1a' and the region R4', and the region R3' is located between the region R1b and the region R4.

Figure 26A:
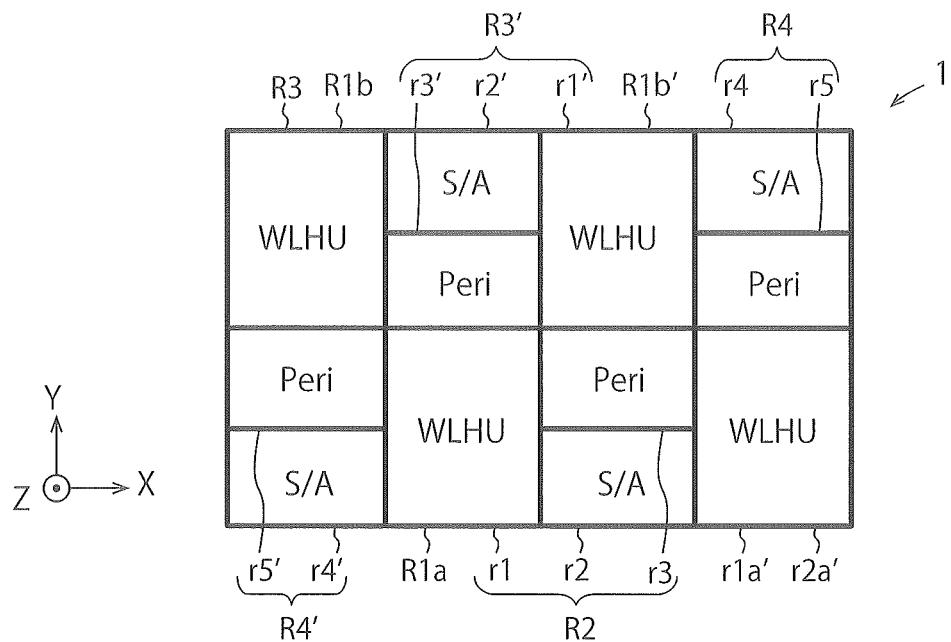
FIGS. 26A and 26B are plan views illustrating details of the semiconductor device illustrated in FIG. 8.
Figure 26B:
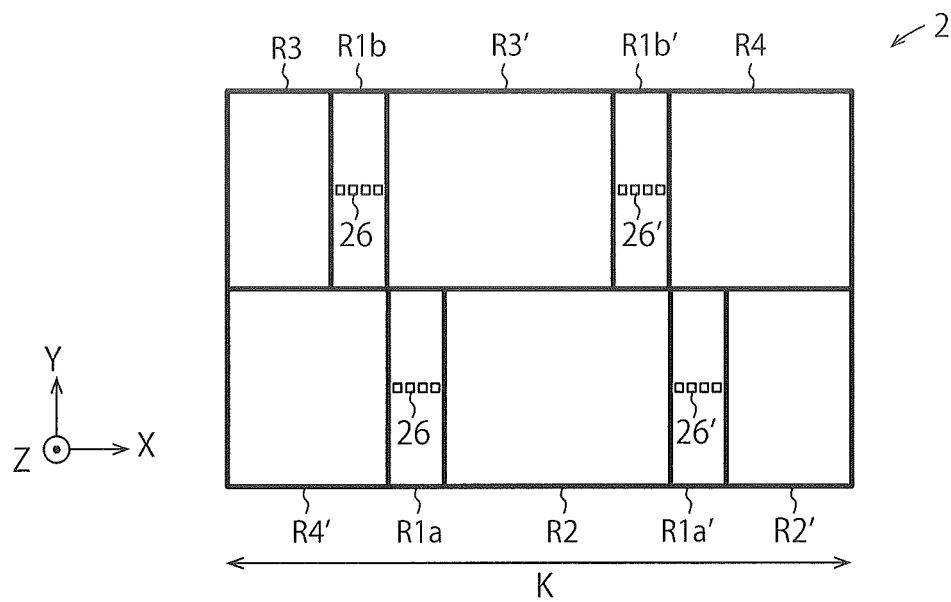

FIGS. 26A and 26B are plan views illustrating details of the semiconductor device illustrated in FIG. 8.

FIG. 26A illustrates a structure of the circuit portion 1. The regions r2, r4, r2' and r4' include sense amplifiers in the peripheral circuits, and the regions r3, r5, r3' and r5' include other portions in the peripheral circuits. Further, the circuit portion 1 includes a hookup region (WLHU) across the regions R1a and r1, a hookup region across the regions R1b and R3, a hookup region across the regions R1a' and R2', and a hookup region across the regions R1b' and r1'.

FIG. 26B illustrates a structure of the array portion 2. The regions R1a and R1a' include the contact plugs 26 and 26', and the respective electrode layers 23 in the regions R1a, R1a', R2, R2' and R4' continuously extend in the X direction in a range indicated by the reference numeral "K". In a similar manner, the regions R1b and R1b' include the contact plugs 26 and 26', and the respective electrode layers 23 in the regions R1b, R1b', R3, R3' and R4 continuously extend in the X direction in a range indicated by the reference numeral "K".

(2) Second Modified Example

Figure 9:
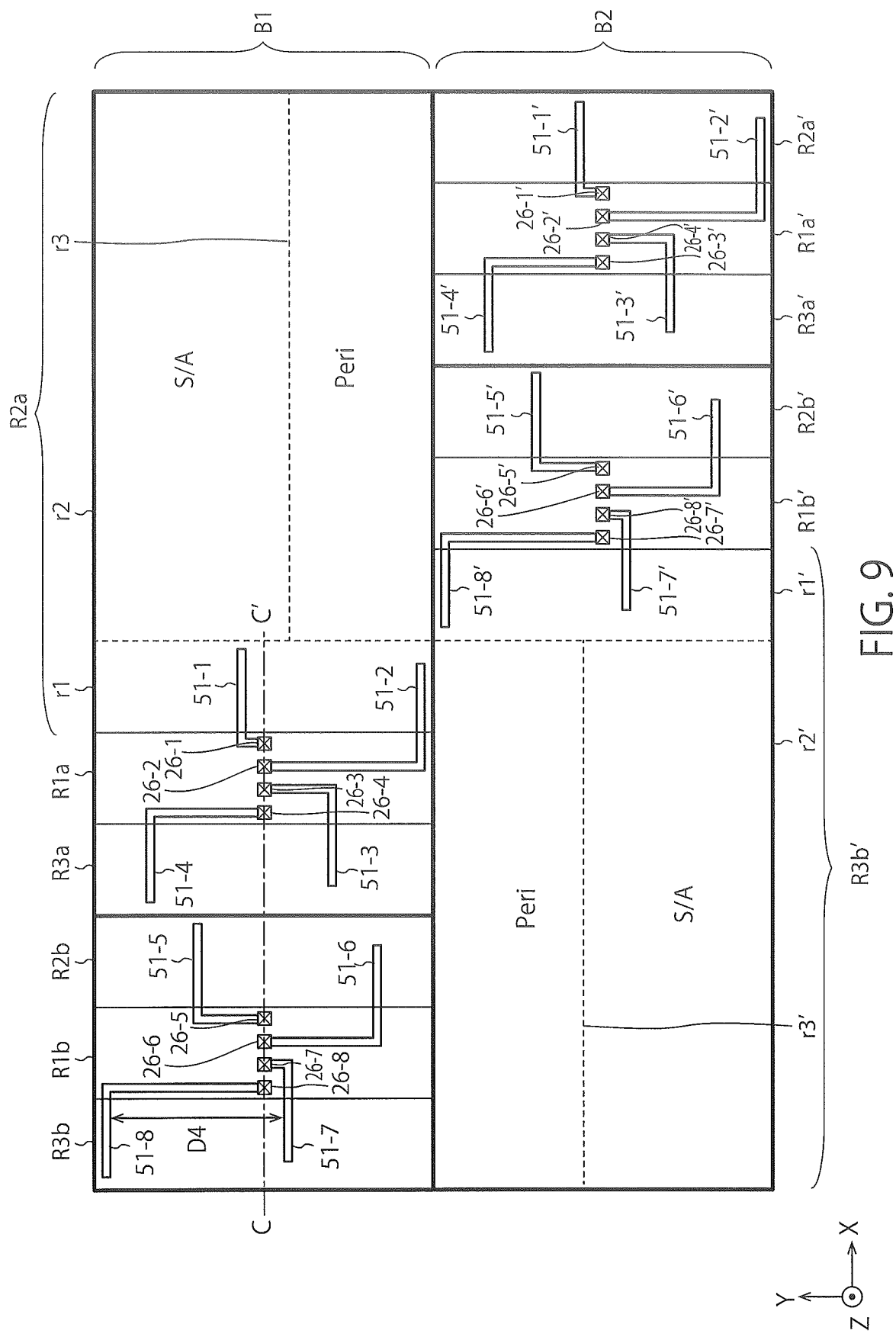
FIG. 9 is a plan view illustrating a structure of a semiconductor device of a second modified example of the first embodiment.

FIG. 9 is a plan view illustrating a structure of a semiconductor device of a second modified example of the first embodiment.

In a similar manner to a case of the first modified example, the region R1 of the present modified example includes regions R1a and R1b which are separated from each other. In the present modified example, further, the region R2 includes regions R2a and R2b which are separated from each other, and the region R3 includes regions R3a and R3b which are separated from each other. The region R2a of the present modified example includes regions r1, r2 and r3 in a similar manner to the region R2 in the first modified example.

The region R2a is located in the +X direction of the region R1a, and the region R2b is located in the +X direction of the region R1b. The region R2a is an example of a third partial region, and the region R2b is an example of a fourth partial region. The region R3a is located in the −X direction of the region R1a, and the region R3b is located in the −X direction of the region R1b. The region R3a is an example of a fifth partial region, and the region R3b is an example of a sixth partial region. The region R5a is located in the +X direction of the region R4a, and the region R5b is located in the +X direction of the region R4b. The region R6a is located in the −X direction of the region R4a, and the region R6b is located in the −X direction of the region R4b.

The contact plugs 26-1 to 26-8 of the present modified example are provided in the regions R1a and R1b. Specifically, the contact plugs 26-1 to 26-4 are provided in the region R1a, and the contact plugs 26-5 to 26-8 are provided in the region R1b. The contact plugs 26-1 to 26-4 are examples of the Ka-th to the Kb-th connection plugs, and the contact plugs 26-5 to 26-8 are examples of the Kc-th to the Kd-th connection plugs. In the present modified example, Ka=1, Kb=4, Kc=5, and Kd=8.

The interconnections 51-1 to 51-8 of the present modified example are respectively located on the side of the region R2a, R2b, R3a or R3b with respect to the contact plugs 26-1 to 26-8. For example, the interconnections 51-1 and 51-2 are respectively located on the side of the region R2a with respect to the contact plugs 26-1 and 26-2. Further, the interconnections 51-5 and 51-6 are respectively located on the side of the region R2b with respect to the contact plugs 26-5 and 26-6. Further, the interconnections 51-3 and 51-4 are respectively located on the side of the region R3a with respect to the contact plugs 26-3 and 26-4. Further, the interconnections 51-7 and 51-8 are respectively located on the side of the region R3b with respect to the contact plugs 26-7 and 26-8.

FIG. 9 indicates a distance D4 between the interconnections 51 adjacent to each other in the Y direction in the region R2a, R2b, R3a or R3b of the present modified example. While the interconnections 51-1 to 51-8 in the first embodiment and the first modified example are located in two regions R2 and R3, the interconnections 51-1 to 51-8 in the present modified example are located in four regions R2a, R2b, R3a and R3b. This makes it possible to make the distance D4 longer than the distance D1 and the distance D3, so that density of the interconnections 51 in the semiconductor device can be further reduced. The distance D4 indicated in FIG. 9 is approximately double the distance D1 indicated in FIG. 2 and the distance D3 indicated in FIG. 8.

Structures of the regions R1a' and R1b' illustrated in FIG. 9 are similar to the structures of the regions R1a and R1b. Further, structures of the regions R2a', R2b', R3a' and R3b' illustrated in FIG. 9 are similar to the structures of the regions R2a, R2b, R3a and R3b. Further, structures of the regions r1', r2' and r3' illustrated in FIG. 9 are respectively similar to the structures of the regions r1, r2 and r3.

Figure 10:
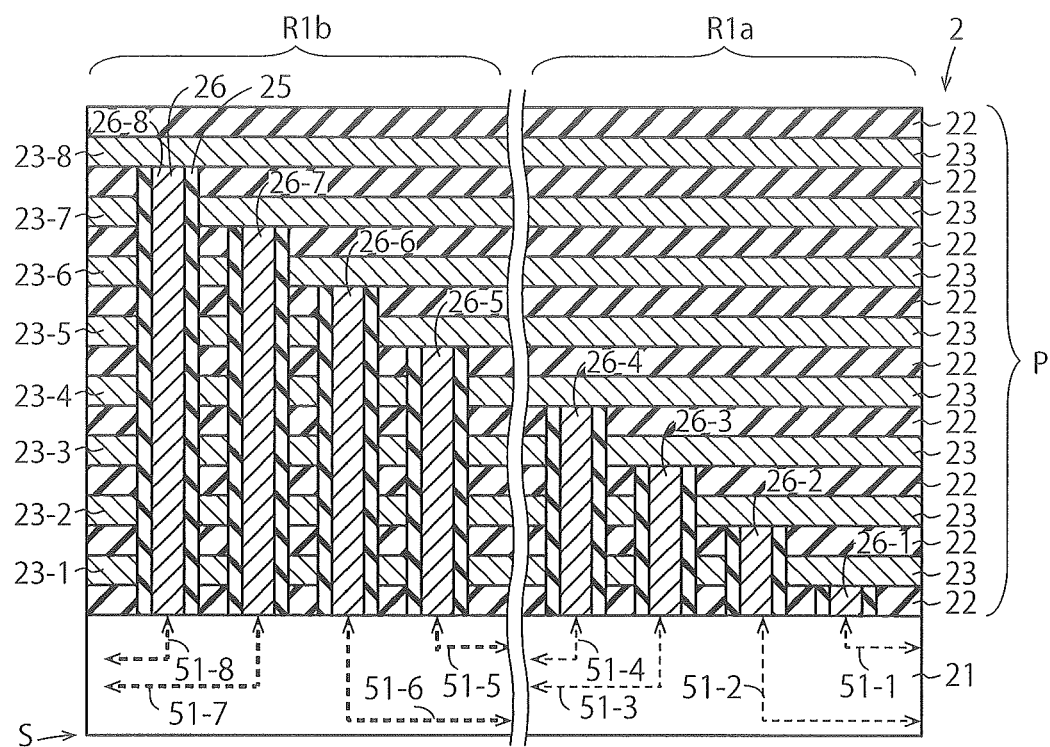
FIG. 10 is a cross-sectional diagram illustrating the structure of the semiconductor device of the second modified example of the first embodiment.

FIG. 10 is a cross-sectional diagram illustrating the structure of the semiconductor device of the second modified example of the first embodiment.

FIG. 10 illustrates an XZ cross-section along a line C-C' illustrated in FIG. 9. In FIG. 10, eight contact plugs 26 of the contact plugs 26-1, 26-2, 26-3, 26-4, 26-5, 26-6, 26-7 and 26-8 are arranged in this order.

Figure 27A:
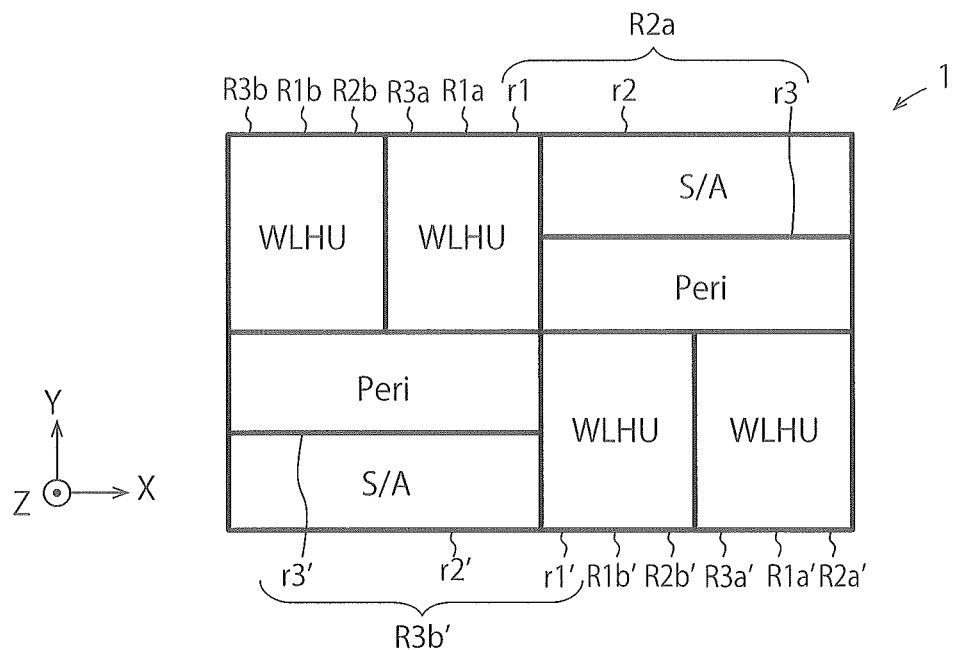
FIGS. 27A and 27B are plan views illustrating details of the semiconductor device illustrated in FIG. 9.
Figure 27B:
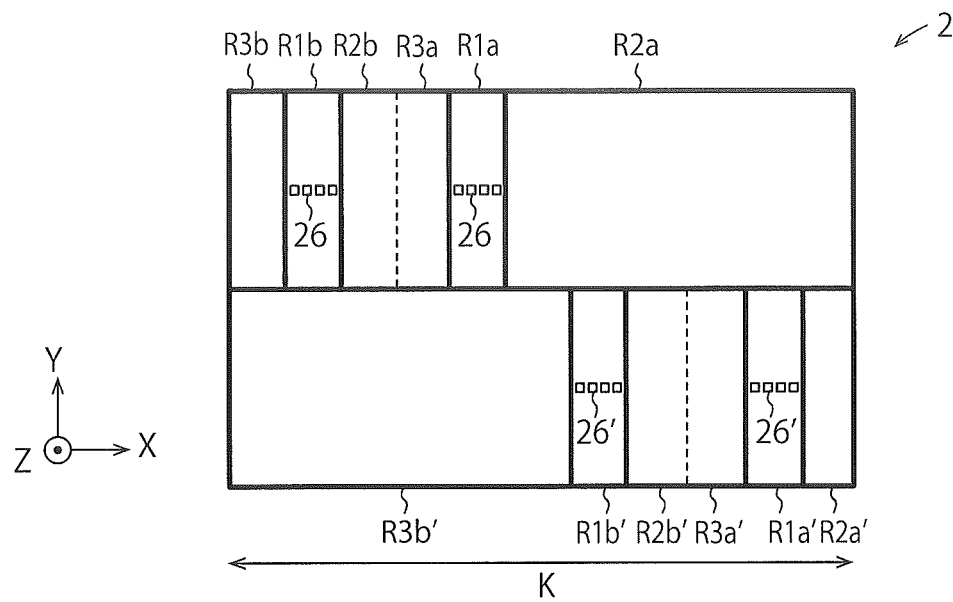

FIGS. 27A and 27B are plan views illustrating details of the semiconductor device illustrated in FIG. 9.

FIG. 27A illustrates a structure of the circuit portion 1. The regions r2 and r2' include sense amplifiers in peripheral circuits, and the regions r3 and r3' include other portions in the peripheral circuits. Further, the circuit portion 1 includes a hookup region (WLHU) across the regions R1a, r1 and R3a, a hookup region across the regions R1b, R2b and R3b, a hookup region across the regions R1a', R2a' and R3a', and a hookup region across the regions R1b', R2b' and r3'.

FIG. 27B illustrates a structure of the array portion 2. The regions R1a and R1b include the contact plugs 26, and the respective electrode layers 23 in the regions R1a, R2a, R3a, Rib, R2b and R3b continuously extend in the X direction in a range indicated by the reference numeral "K". In a similar manner, the regions R1a' and R1b' include the contact plugs 26', and the respective electrode layers 23 in the regions R1a', R2a', R3a', R1b', R2b' and R3b' continuously extend in the X direction in a range indicated by the reference numeral "K".

(3) Third Modified Example

Figure 11:
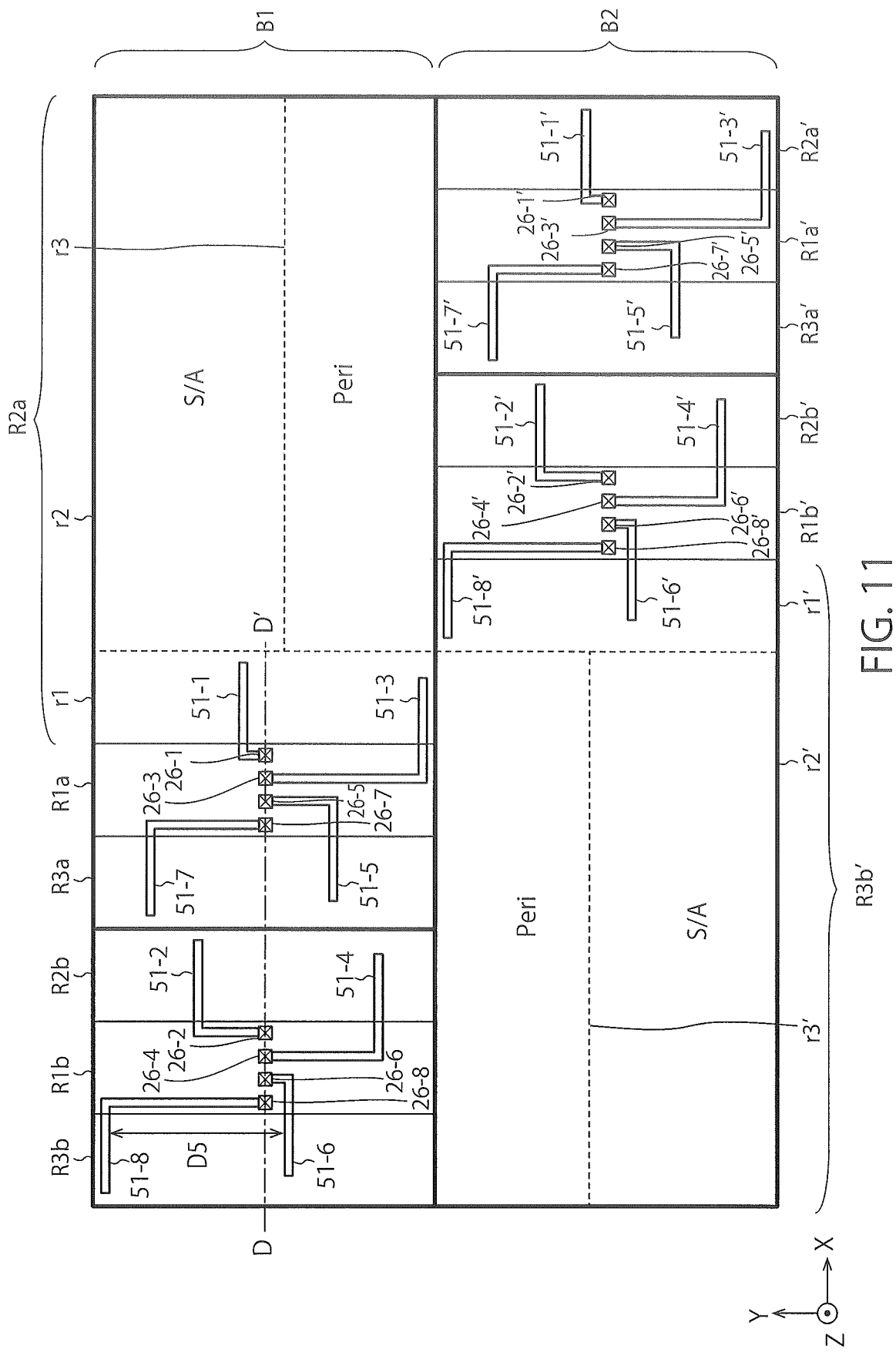
FIG. 11 is a plan view illustrating a structure of a semiconductor device of a third modified example of the first embodiment.

FIG. 11 is a plan view illustrating a structure of a semiconductor device of a third modified example of the first embodiment.

In a similar manner to a case of the second modified example, the regions R1 to R3 of the present modified example include the regions R1a, R1b, R2a, R2b, R3a and R3b, and the region R2a of the present modified example includes regions r1, r2 and r3.

The contact plugs 26-1 to 26-8 of the present modified examples are provided in the regions R1a and R1b. Specifically, the contact plugs 26-1, 26-3, 26-5 and 26-7 are provided in the region R1a, and the contact plugs 26-2, 26-4, 26-6 and 26-8 are provided in the region R1b. The contact plugs 26-1, 26-3, 26-5 and 26-7 are examples of the K3-th connection plug (K3 is an odd number which satisfies 1≤K3≤8). The contact plugs 26-2, 26-4, 26-6 and 26-8 are examples of the K4-th connection plug (K4 is an even number which satisfies 1≤K4≤8).

The interconnections 51-1 to 51-8 of the present modified example are respectively located on the side of the region R2a, R2b, R3a or R3b with respect to the contact plugs 26-1 to 26-8. For example, the interconnections 51-1 and 51-3 are respectively located on the side of the region R2a with respect to the contact plugs 26-1 and 26-3. Further, the interconnections 51-2 and 51-4 are respectively located on the side of the region R2b with respect to the contact plugs 26-2 and 26-4. Further, the interconnections 51-5 and 51-7 are respectively located on the side of the region R3a with respect to the contact plugs 26-5 and 26-7. Further, the interconnections 51-6 and 51-8 are respectively located on the side of the region R3b with respect to the contact plugs 26-6 and 26-8.

FIG. 11 indicates a distance D5 between the interconnections 51 adjacent to each other in the Y direction in the region R2a, R2b, R3a or R3b of the present modified example. While the interconnections 51-1 to 51-8 in the first embodiment and the first modified example are arranged in two regions R2 and R3, the interconnections 51-1 to 51-8 of the present modified example are arranged in four regions R2a, R2b, R3a and R3b in a similar manner to a case of the second modified example. This makes it possible to make the distance D5 longer than the distance D1 and the distance D3, so that density of the interconnections 51 in the semiconductor device can be further reduced. The distance D5 illustrated in FIG. 11 is comparable with the distance D4 illustrated in FIG. 9.

Structures of the regions R1a' and R1b' illustrated in FIG. 11 are similar to the structures of the regions R1a and R1b. Further, structures of the regions R2a', R2b', R3a' and R3b' illustrated in FIG. 11 are similar to the structures of the regions R2a, R2b, R3a and R3b. Further, structures of the regions r1', r2' and r3' illustrated in FIG. 11 are respectively similar to the structures of the regions r1, r2 and r3.

FIG. 12 is a cross-sectional diagram illustrating the structure of the semiconductor device of the third modified example of the first embodiment.

FIG. 12 illustrates an XZ cross-section along a line D-D' illustrated in FIG. 11. In FIG. 12, eight contact plugs 26 of the contact plugs 26-1, 26-3, 26-5, 26-7, 26-2, 26-4, 26-6 and 26-8 are arranged in this order.

The structure illustrated in FIGS. 27A and 27B is also applied to the present modified example.

(4) Fourth Modified Example

Figure 13:
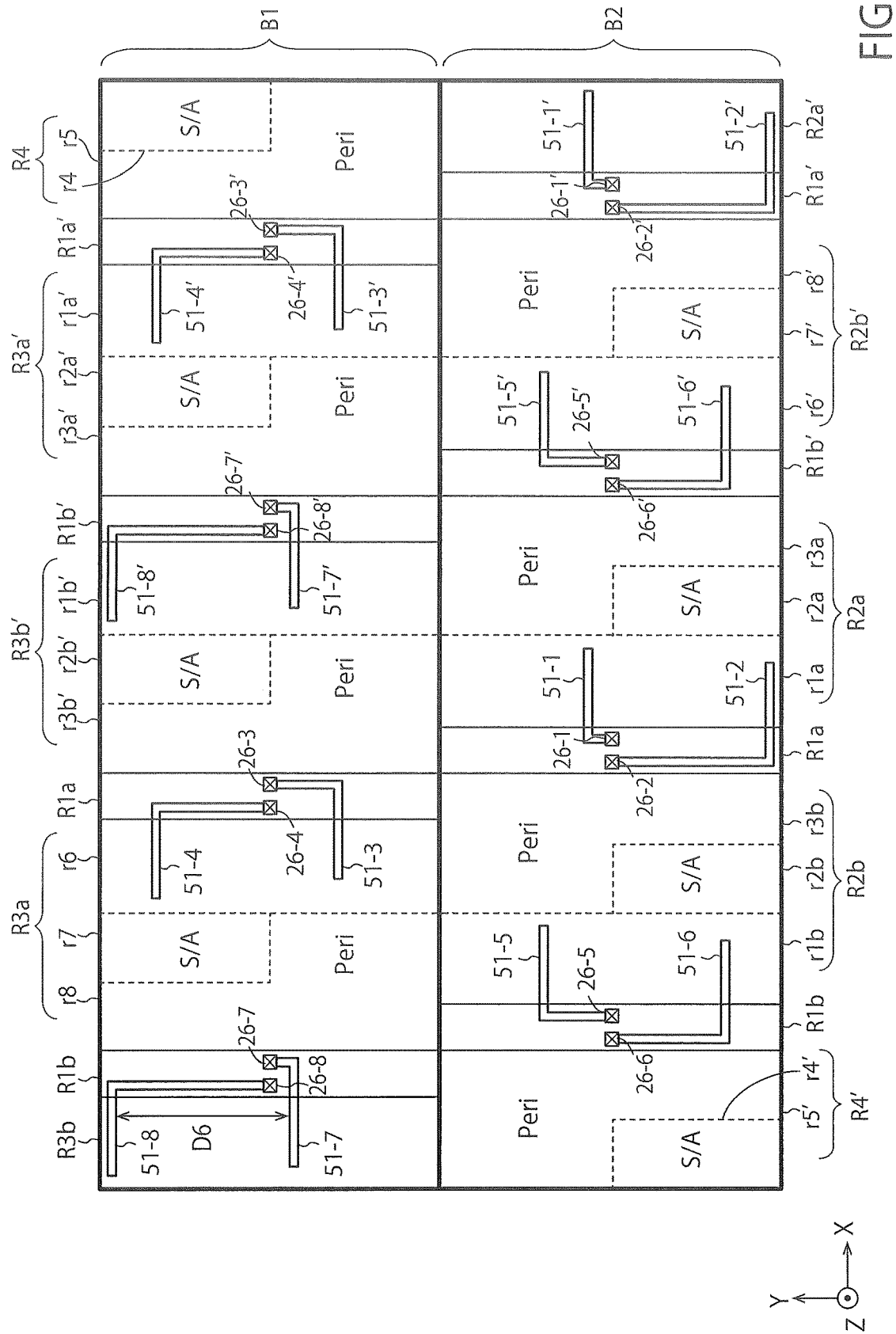
FIG. 13 is a plan view illustrating a structure of a semiconductor device of a fourth modified example of the first embodiment.

FIG. 13 is a plan view illustrating a structure of a semiconductor device of a fourth modified example of the first embodiment.

In a similar manner to a case of the second and the third modified examples, the regions R1 to R3 of the present modified example include the regions R1a, R1b, R2a, R2b, R3a and R3b. However, the region R1 of the present modified example includes two regions R1a and two regions R1b which are separated from each other. Further, the region R2a includes regions r1a, r2a and r3a. The region R2b includes regions r1b, r2b and r3b. The region R4 includes regions r4 and r5. The region R3a includes regions r6, r7 and r8. The regions r1a, r2a, r3a, r1b, r2b, r3b, r4, r5, r6, r7 and r8 include sense amplifiers and other portions in the peripheral circuits as illustrated in FIG. 13.

The region R2a is located in the +X direction of one of the regions R1a, and the region R3a is located in the −X direction of the other of the regions R1a. The region R2b is located in the +X direction of one of the regions Rib, and the region R3b is located in the −X direction of the other of the regions R1b. The region R5a is located in the +X direction of one of the regions R4a, and the region R6a is located in the −X direction of the other of the regions R4a. The region R5*b* is located in the +X direction of one of the regions R4*b*, and the region R6*b* is located in the −X direction of the other of the regions R4*b*.

The contact plugs 26-1 to 26-8 of the present modified example are provided in the regions R1*a* and R1*b*. Specifically, the contact plugs 26-1 and 26-2 are provided in one of the regions R1*a*, and the contact plugs 26-3 and 26-4 are provided in the other of the regions R1*a*. Further, the contact plugs 26-5 and 26-6 are provided in one of the regions R1*b*, and the contact plugs 26-7 and 26-8 are provided in the other of the regions Rib. The contact plugs 26-1 to 26-4 are examples of the Ka-th to the Kb-th connection plug, and the contact plugs 26-5 to 26-8 are examples of the Kc-th to the Kd-th connection plugs. In the present modified example, Ka=1, Kb=4, Kc=5, and Kd=8.

The interconnections 51-1 to 51-8 of the present modified example are respectively located on the side of the region R2*a*, R2*b*, R3*a* or R3*b* with respect to the contact plugs 26-1 to 26-8. For example, the interconnections 51-1 and 51-2 are respectively located on the side of the region R2*a* with respect to the contact plugs 26-1 and 26-2. Further, the interconnections 51-3 and 51-4 are respectively located on the side of the region R3*a* with respect to the contact plugs 26-3 and 26-4. Further, the interconnections 51-5 and 51-6 are respectively located on the side of the region R2*b* with respect to the contact plugs 26-5 and 26-6. Further, the interconnections 51-7 and 51-8 are respectively located on the side of the region R3*b* with respect to the contact plugs 26-7 and 26-8.

FIG. 13 indicates a distance D6 between the interconnections 51 adjacent to each other in the Y direction in the region R2*a*, R2*b*, R3*a* or R3*b* of the present modified example. The interconnections 51-1 to 51-8 of the present modified example are disposed in four regions R2*a*, R2*b*, R3*a* and R3*b* in a similar manner to a case of the second and the third modified examples. This makes it possible to make the distance D6 longer, so that density of the interconnections 51 in the semiconductor device can be reduced. The distance D6 indicated in FIG. 13 is comparable with the distances D4 and D5 indicated in FIGS. 9 and 11.

Structures of the regions R1*a'*, R1*b'*, R2*a'*, R2*b'*, R3*a'*, R3*b'* and R4' illustrated in FIG. 13 are similar to the structures of the regions R1*a*, R1*b*, R2*a*, R2*b*, R3*a*, R3*b* and R4. Further, structures of the regions r1*a'*, r2*a'*, r3*a'*, r1*b'*, r2*b'*, r3*b'*, r4', r5', r6', r7' and r8' illustrated in FIG. 13 are similar to the structures of the regions r1*a*, r2*a*, r3*a*, r1*b*, r2*b*, r3*b*, r4, r5, r6, r7 and r8. For example, the regions R1*a*, R3*a* and R3*b'* in the stacked film P of the block B1 are examples of first, second and third regions in a first stacked film, and the regions R1*a*, R2*b* and R2*a* in the stacked film P of the block B2 are examples of fourth, fifth and sixth regions in a second stacked film. The contact plug 26 in the block B1 is an example of a first electrode layer plug, and the contact plug 26 in the block B2 is an example of a second electrode layer plug.

Further, the region r5 of the present modified example has an L shape and includes a portion put between the region r4 and the region R1*a'*, and a portion put between the region r4 and the region R2*a'*. In a similar manner, the region r5' of the present modified example has an L shape and includes a portion put between the region r4' and the region R1*b*, and a portion put between the region r4' and the region R3*b*.

Figure 28A:
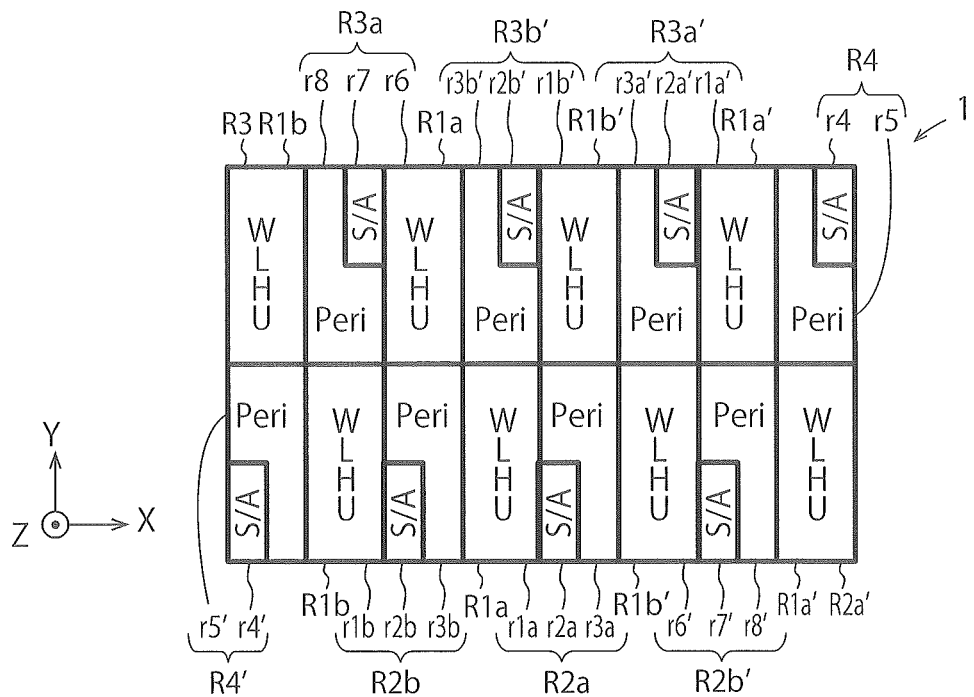
FIGS. 28A and 28B are plan views illustrating details of the semiconductor device illustrated in FIG. 13.
Figure 28B:
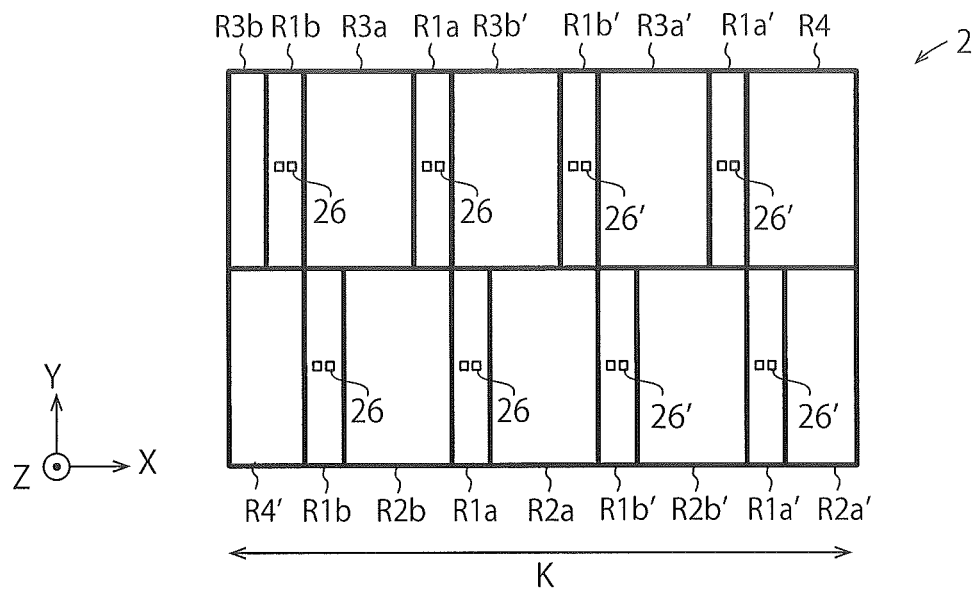

FIGS. 28A and 28B are plan views illustrating details of the semiconductor device illustrated in FIG. 13.

FIG. 28A illustrates a structure of the circuit portion 1. The regions r2*a*, r2*b*, r4, r7, r2*a'*, r2*b'*, r4' and r7' include sense amplifiers in peripheral circuits, and the regions r3*a*, r3*b*, r5, r8, r3*a'*, r3*b'*, r5' and r8' include other portions in the peripheral circuits. Further, the circuit portion 1 includes a hookup region (WLHU) across the regions R1*a* and r1*a*, a hookup region across the regions R1*b* and r1*b*, a hookup region across the regions R1*a* and r6, and a hookup region across the regions R1*b* and R3*b*. Further, the circuit portion 1 includes a hookup region across the regions R1*a'* and r1*a'*, a hookup region across the regions R1*b'* and r1*b'*, a hookup region across the regions R1*a'* and R2*a'*, and a hookup region across the regions R1*b'* and r6'.

FIG. 28B illustrates a structure of the array portion 2. The regions R1*a*, R1*b*, R1*a'* and R1*b'* in the +Y direction include the contact plugs 26, and the respective electrode layers 23 in the regions R1*a*, R1*b*, R1*a'* and R1*b'* in the +Y direction continuously extend in the X direction in a range indicated by the reference numeral "K". In a similar manner, the regions R1*a*, R1*b*, R1*a'* and R1*b'* in the −Y direction include the contact plugs 26, and the respective electrode layers 23 in the regions R1*a*, R1*b*, R1*a'* and R1*b'* in the −Y direction continuously extend in the X direction in a range indicated by the reference numeral "K".

(5) Fifth Modified Example

Figure 14:
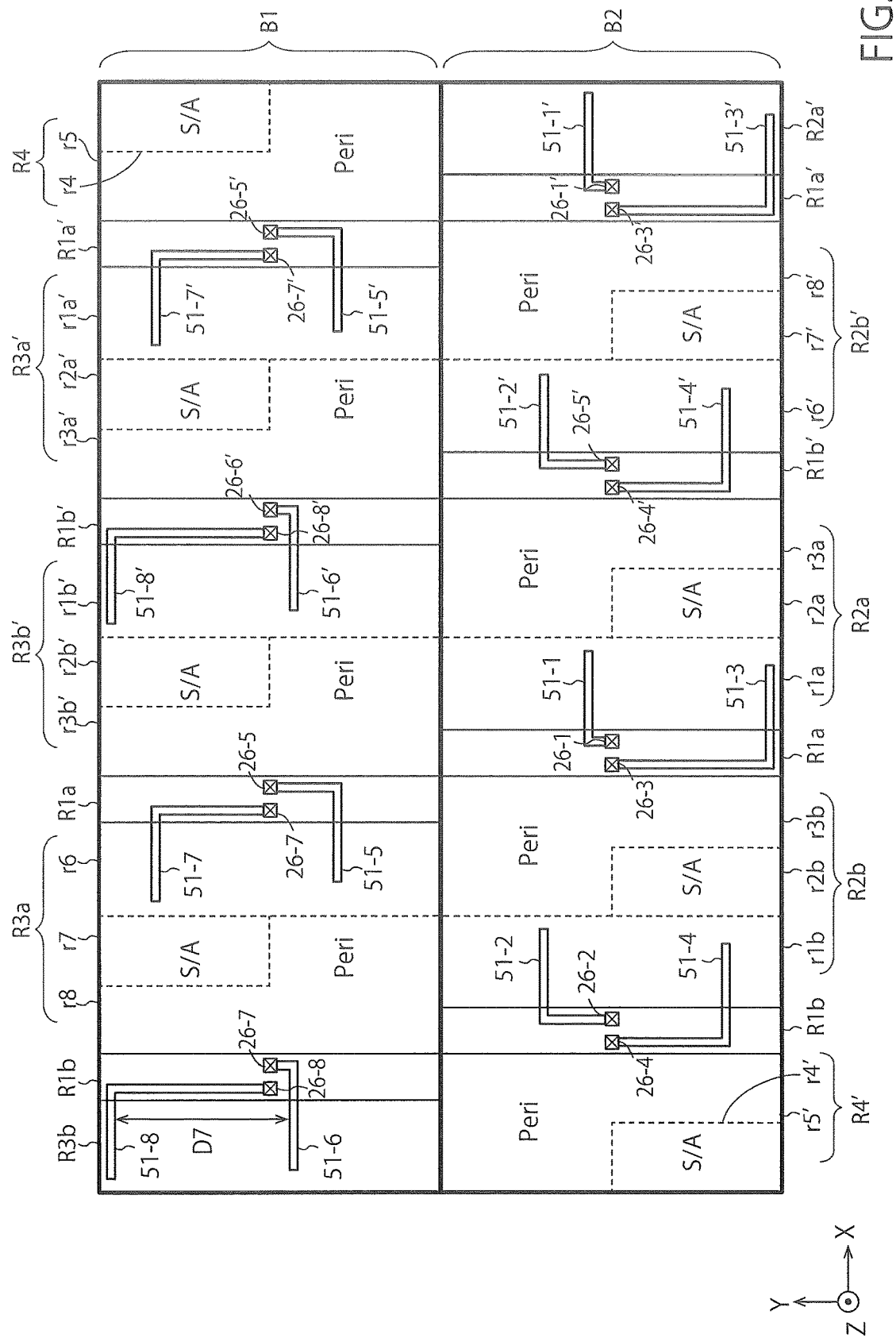
FIG. 14 is a plan view illustrating a structure of a semiconductor device of a fifth modified example of the first embodiment.

FIG. 14 is a plan view illustrating a structure of a semiconductor device of a fifth modified example of the first embodiment.

In a similar manner to a case of the fourth modified example, the regions R1 to R3 of the present modified example include regions R1*a* to R3*b*, and the region R1 of the present modified example includes two regions R1*a* and two regions R1*b* which are separated from each other. Further, the region R2*a* includes regions r1*a*, r2*a* and r3*a*. The region R2*b* includes regions r1*b*, r2*b* and r3*b*. The region R4 includes regions r4 and r5. The region R3*a* includes regions r6, r7 and r8. The regions r1*a*, r2*a*, r3*a*, r1*b*, r2*b*, r3*b*, r4, r5, r6, r7 and r8 include sense amplifiers and other portions in peripheral circuits as illustrated in FIG. 14.

The contact plugs 26-1 to 26-8 of the present modified example are provided in the regions R1*a* and R1*b*. Specifically, the contact plugs 26-1 and 26-3 are provided in one of the regions R1*a*, and the contact plugs 26-5 and 26-7 are provided in the other of the regions R1*a*. Further, the contact plugs 26-2 and 26-4 are provided in one of the regions Rib, and the contact plugs 26-6 and 26-8 are provided in the other of the regions Rib. The contact plugs 26-1, 26-3, 26-5 and 26-7 are examples of the K1-th connection plug. The contact plugs 26-2, 26-4, 26-6 and 26-8 are examples of the K2-th connection plug.

The interconnections 51-1 to 51-8 of the present modified example are respectively located on the side of the region R2*a*, R2*b*, R3*a* or R3*b* with respect to the contact plugs 26-1 to 26-8. For example, the interconnections 51-1 and 51-3 are respectively located on the side of the region R2*a* with respect to the contact plugs 26-1 and 26-3. Further, the interconnections 51-5 and 51-7 are respectively located on the side of the region R3*a* with respect to the contact plugs 26-5 and 26-7. Further, the interconnections 51-2 and 51-4 are respectively located on the side of the region R2*b* with respect to the contact plugs 26-2 and 26-4. Further, the interconnections 51-6 and 51-8 are respectively located on the side of the region R3*b* with respect to the contact plugs 26-6 and 26-8.

FIG. 14 indicates a distance D7 between the interconnections 51 adjacent to each other in the Y direction in the region R2*a*, R2*b*, R3*a* or R3*b* of the present modified example. The interconnections 51-1 to 51-8 of the present modified example are disposed in four regions R2a, R2b, R3a and R3b in a similar manner to a case of the second to the fourth modified examples. This makes it possible to make the distance D7 longer, so that density of the interconnections 51 in the semiconductor device can be reduced. The distance D7 indicated in FIG. 14 is comparable with the distances D4, D5 and D6 indicated in FIG. 9, FIG. 11 and FIG. 13.

Structures of the regions R1a', R1b', R2a', R2b', R3a', R3b' and R4' illustrated in FIG. 14 are similar to the structures of the regions R1a, R1b, R2a, R2b, R3a, R3b and R4. Further, structures of the regions r1a', r2a', r3a', r1b', r2b', r3b', r4', r5', r6', r7' and r8' illustrated in FIG. 14 are similar to the structures of the regions r1a, r2a, r3a, r1b, r2b, r3b, r4, r5, r6, r7 and r8.

Further, the structure illustrated in FIGS. 28A and 28B is also applied to the present modified example. Further, the region R1 in the fourth or the fifth modified example may include M regions R1a and M regions R1b which are separated from each other (M is an integer equal to or greater than 2).

Next, the first embodiment will be compared with the comparative example of the first embodiment again with reference to FIGS. 15 and 16.

Figure 15:
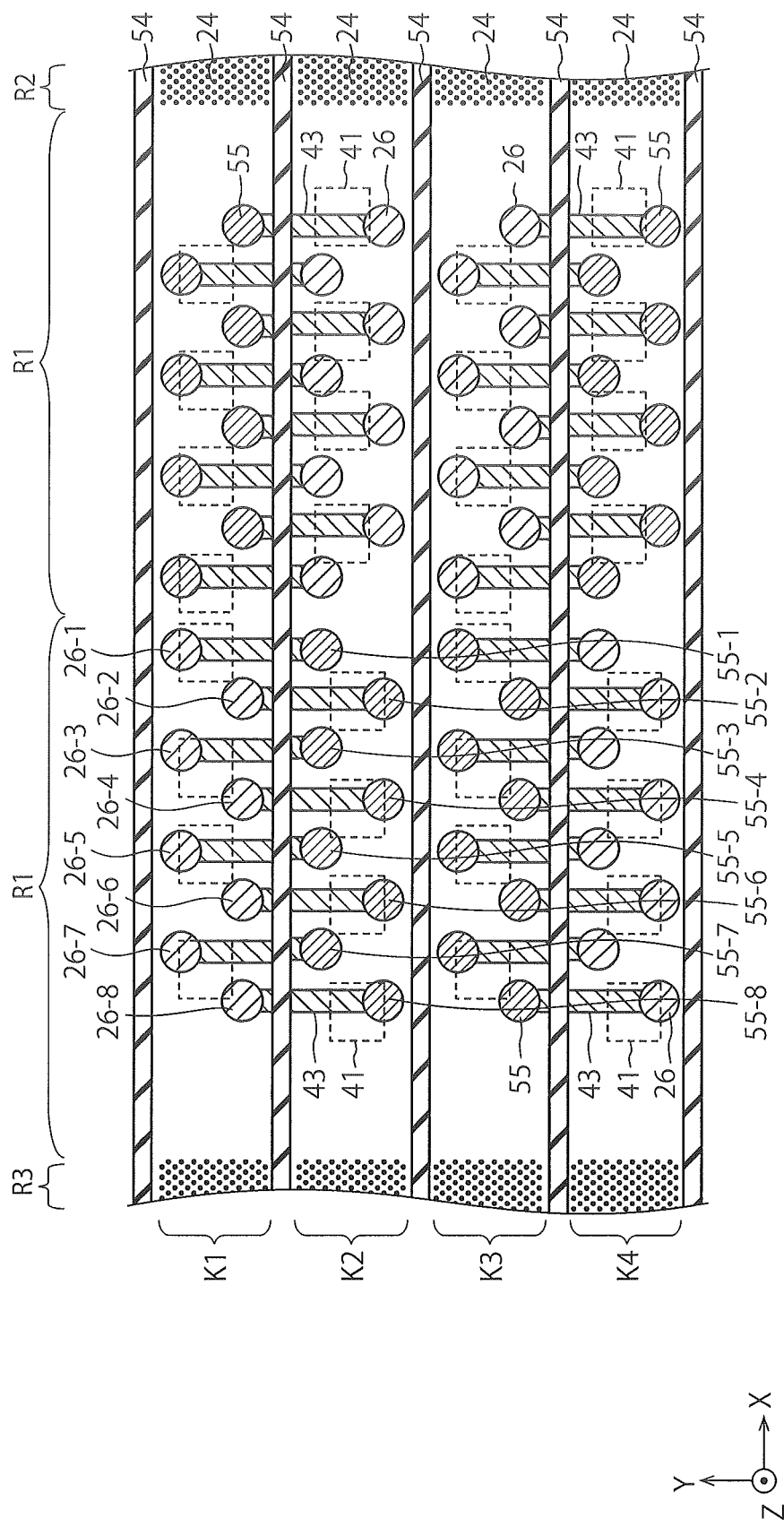
FIG. 15 is a plan view illustrating the structure of the semiconductor device of the first embodiment.

FIG. 15 is a plan view illustrating the structure of the semiconductor device of the first embodiment.

As illustrated in FIGS. 1 and 2, the semiconductor device of the present embodiment includes regions R1, R2, R3, or the like. This semiconductor device may have the structure illustrated in FIG. 15. The semiconductor device illustrated in FIG. 15 includes two regions R1 between the region R2 and the region R3. FIG. 15 will be described in detail below.

The semiconductor device illustrated in FIG. 15 includes regions K1, K2, K3 and K4 in the regions R1, R2 and R3. The regions K1 to K4 extend in the X direction and are separated from each other by the insulators 54. The insulators 54 are embedded into slits formed so as to penetrate through the stacked film P (see FIG. 1).

Each of the regions K1 to K4 includes eight contact plugs 26 in one of the regions R1 and includes eight contact plugs 55 in the other of the regions R1. FIG. 15 illustrates contact plugs 26-1 to 26-8 in the region K1 as examples of the contact plugs 26 and illustrates contact plugs 55-1 to 55-8 in the region K2 as examples of the contact plugs 55. Structures of the contact plugs 26 and 55 will be described below using the contact plugs 26-1 to 26-8 and 55-1 to 55-8 as examples.

As described above, the contact plugs 26-1 to 26-8 are respectively electrically connected to the electrode layers 23-1 to 23-8 (FIG. 1). Meanwhile, all the contact plugs 55-1 to 55-8 penetrate through the stacked film P. As illustrated in FIG. 15, the contact plugs 26-1 to 26-8 are respectively electrically connected to the contact plugs 55-1 to 55-8 with eight interconnections in the interconnection layer 43. These interconnections are respectively electrically connected to the circuit portion 1 (FIG. 1) via the metal pads 41. The present embodiment makes it possible to electrically connect circuits above the stacked film P to the contact plugs 26-1 to 26-8 via the contact plugs 55-1 to 55-8.

Figure 16:
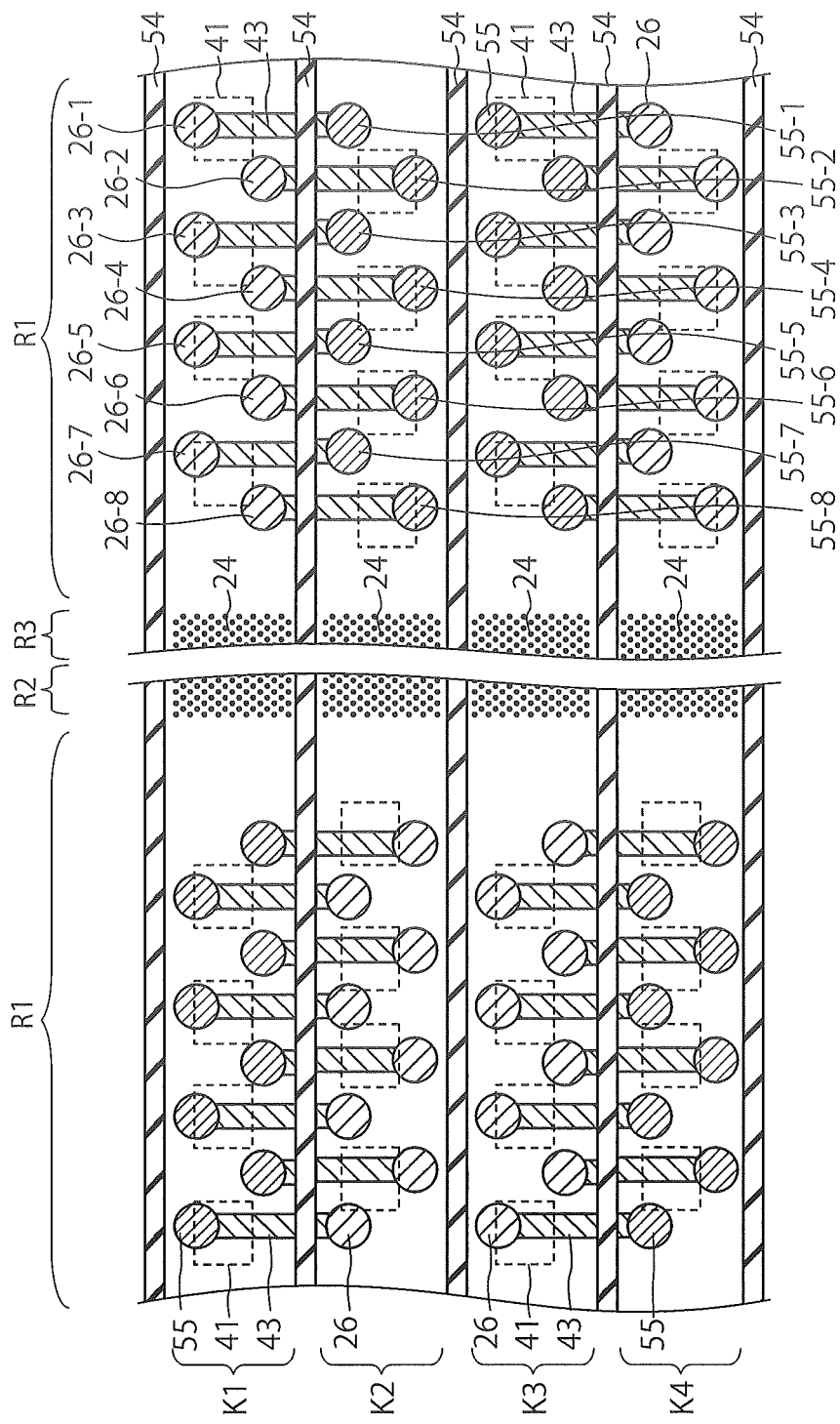
FIG. 16 is a plan view illustrating the structure of the semiconductor device of the comparative example of the first embodiment.

FIG. 16 is a plan view illustrating the structure of the semiconductor device of the comparative example of the first embodiment.

As illustrated in FIGS. 3 and 4, the semiconductor device of the present comparative example includes regions R1, R2, or the like. This semiconductor device may have the structure illustrated in FIG. 16. The semiconductor device illustrated in FIG. 16 includes the above-described regions R1 and R2 and further includes a region R3 and another region R1. In FIG. 16, the regions R2 and R3 are put between the two regions R1. FIG. 16 will be described in detail below.

The semiconductor device illustrated in FIG. 16 also includes regions K1, K2, K3 and K4 in the regions R1, R2 and R3. Structures of the regions K1 to K4 illustrated in FIG. 16 are substantially similar to the structures of the regions K1 to K4 illustrated in FIG. 15.

In the comparative example, all the contact plugs 26 in the region K1 are electrically connected to the interconnections 51 (FIG. 3 and FIG. 4) extending toward the region R3. This makes density of the interconnections 51 in the region K1 higher in the region R3. Further, all the contact plugs 26 in the region K2 are electrically connected to the interconnections 51 extending toward the region R2. This makes density of the interconnections 51 in the region K2 higher in the region R2.

Meanwhile, in the first embodiment, the contact plugs 26 in the region K1 are electrically connected to the interconnections 51 (FIGS. 1 and 2) extending toward the region R2 and the interconnections 51 extending toward the region R3. This makes density of the interconnections 51 in the region K1 lower in the regions R2 and R3. In a similar manner, the contact plugs 26 in the region K2 are electrically connected to the interconnections 51 extending toward the region R2 and the interconnections 51 extending toward the region R3. This makes density of the interconnections 51 in the region K2 lower in the regions R2 and R3. In this manner, the present embodiment makes it possible to reduce density of the interconnections 51 in the semiconductor device.

FIGS. 17A to 20B are cross-sectional diagrams illustrating a method of manufacturing the semiconductor device of the first embodiment. Specifically, FIGS. 17A to 20B illustrate a manufacturing method of the array portion 2 (array wafer) before being bonded illustrated in FIG. 6.

Figure 17A:
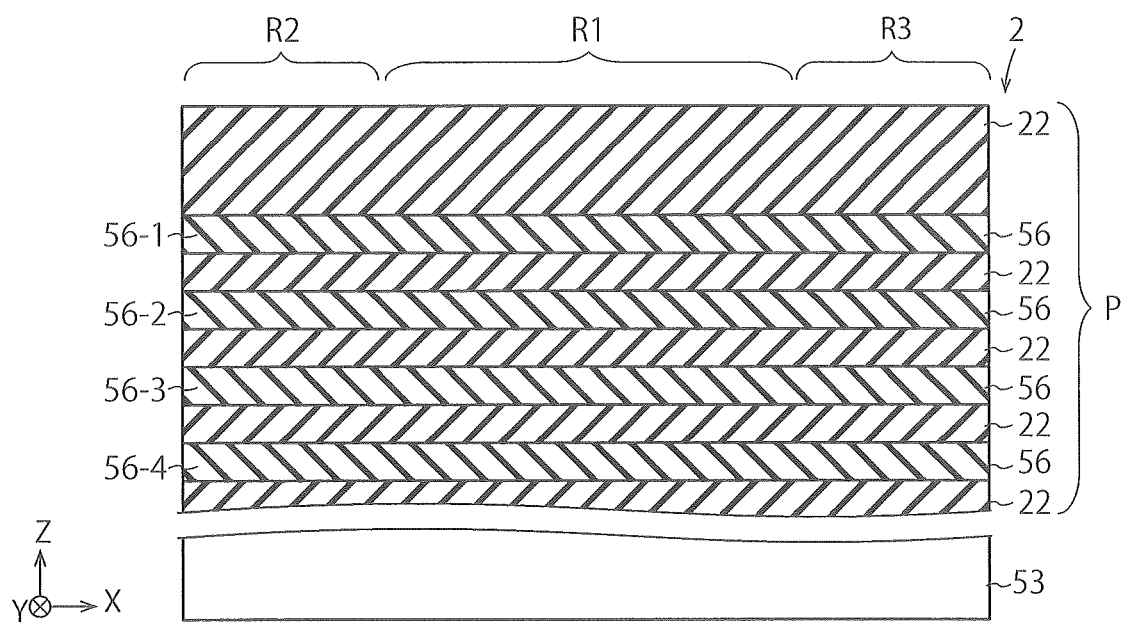
FIGS. 17A to 20B are cross-sectional diagrams illustrating a method of manufacturing the semiconductor device of the first embodiment.

First, the stacked film P is formed on the substrate 53 (FIG. 17A). In this event, the stacked film P is formed so as to alternately include a plurality of insulators 22 and a plurality of sacrifice layers 56. These sacrifice layers 56 are separated from each other in the Z direction. These sacrifice layers 56 are replaced with a plurality of electrode layers 23 in process which will be described later. Each sacrifice layer 56 is, for example, a silicon nitride film.

FIG. 17A illustrates four sacrifice layers 56-1 to 56-4 as examples of these sacrifice layers 56. The stacked film P sequentially includes the sacrifice layers 56-1 to 56-4 in the Z direction. However, the sacrifice layer 56-1 is positioned at the top in FIG. 17A, and the sacrifice layer 56-4 is positioned at the bottom in FIG. 17A. The sacrifice layers 56-1 to 56-4 are examples of the first to the N-th layers (N is an integer equal to or greater than 2). While a value of N is 4 in FIG. 17A, the value of N may be an integer (for example, 8) other than 4.

FIG. 17A further illustrates the regions R1, R2 and R3 on the substrate 53. A plurality of contact plugs 26 are formed in the region R1 and a plurality of columnar portions 24 are formed in the regions R2 and R3 in process which will be described later. These regions R1 to R3 are to be transferred on the substrate 11 later.

In FIG. 17A, a thickness of the insulator 22 at the top is set thicker than thicknesses of other insulators 22. Each insulator 22 is, for example, a silicon oxide film.

Figure 17B:
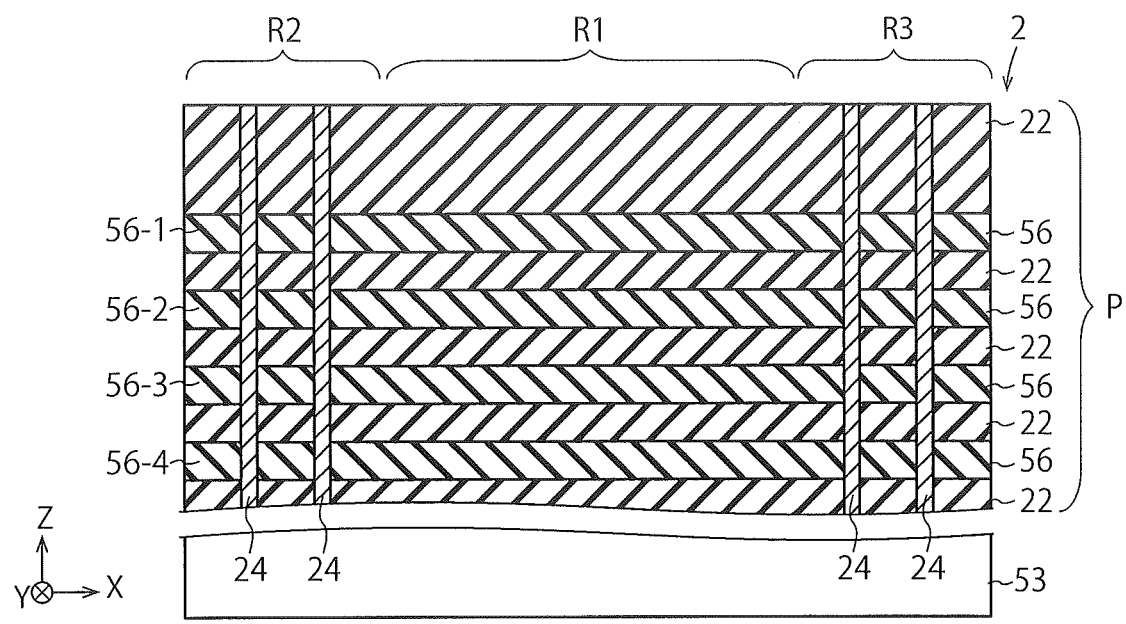

Then, a plurality of columnar portions 24 are formed in the stacked film P (FIG. 17B). As described above, these columnar portions 24 are formed in the regions R2 and R3. Each columnar portion 24 is formed by the block insulator 24a, the charge storage layer 24b, the tunnel insulator 24c, the channel semiconductor layer 24d and the core insulator 24e being sequentially embedded into an opening which penetrates through the stacked film P (see FIG. 5).

Figure 18A:
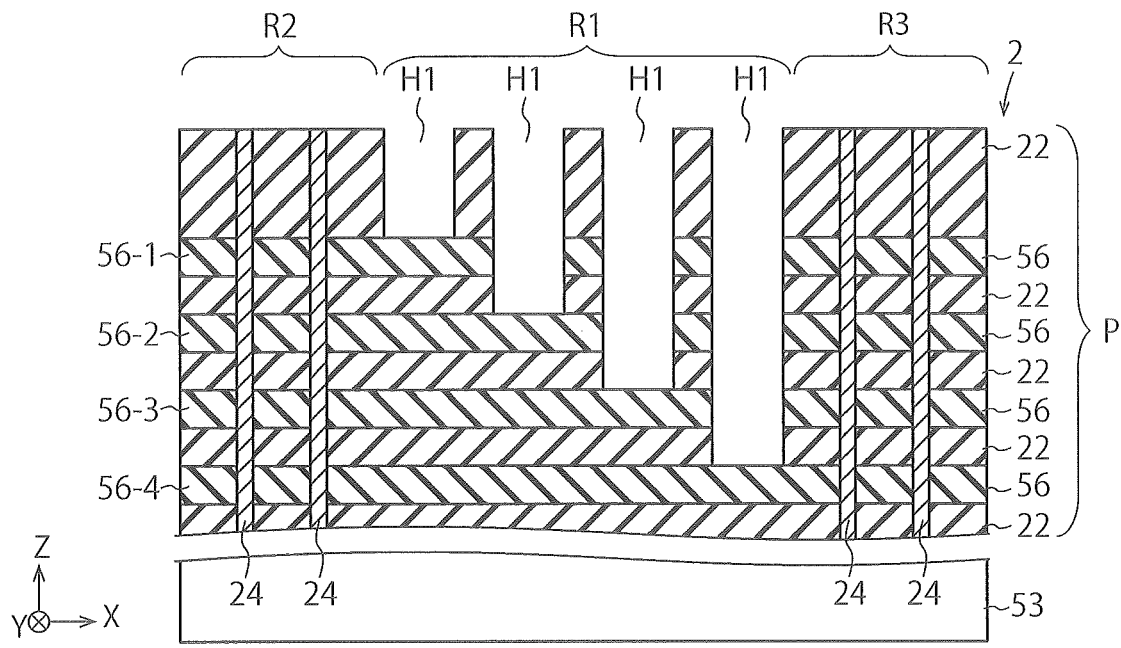

Then, a plurality of openings H1 are formed in the stacked film P through reactive ion etching (RIE) (FIG. 18A). These openings H1 are formed in the region R1. FIG. 18A illustrates an opening H1 which reaches the sacrifice layer 56-1, an opening H1 which reaches the sacrifice layer 56-2, an opening H1 which reaches the sacrifice layer 56-3, and an opening H1 which reaches the sacrifice layer 56-4. In this manner, these openings H1 are formed to reach the sacrifice layers 56 which are different from each other.

Figure 18B:
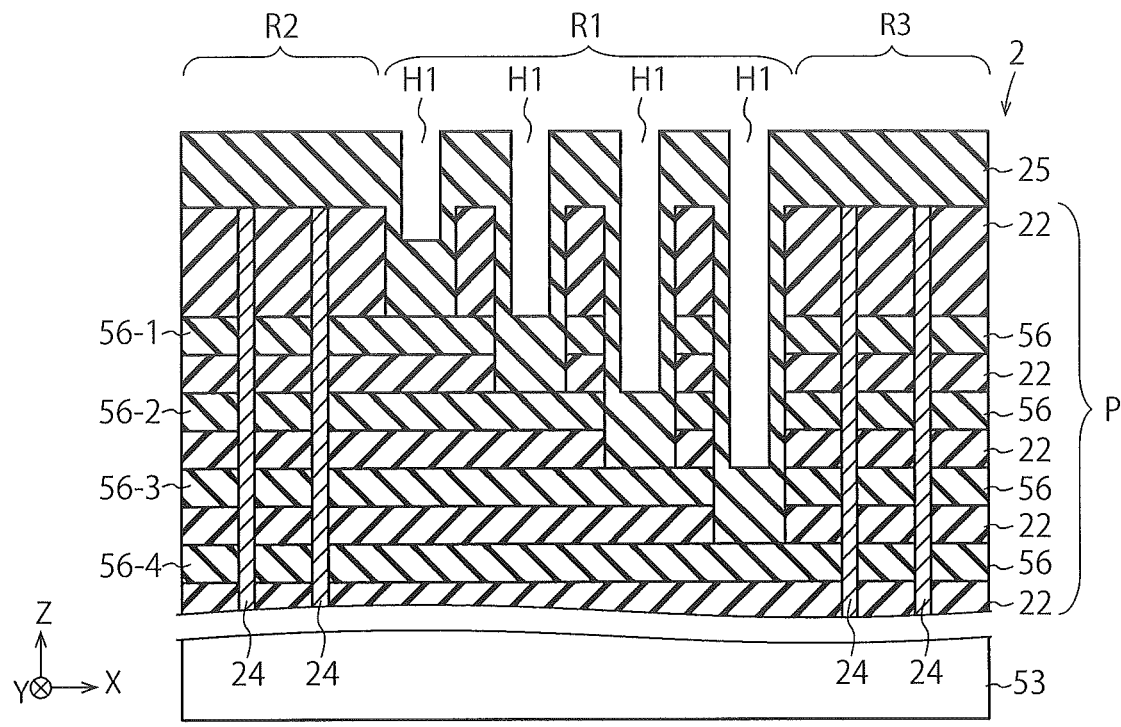

Then, the insulator 25 is formed on the entire surface of the substrate 53 (FIG. 18B). As a result, the insulator 25 is formed on a side surface and a bottom surface of each opening H1. The insulator 25 is, for example, a silicon oxide film.

Figure 19A:
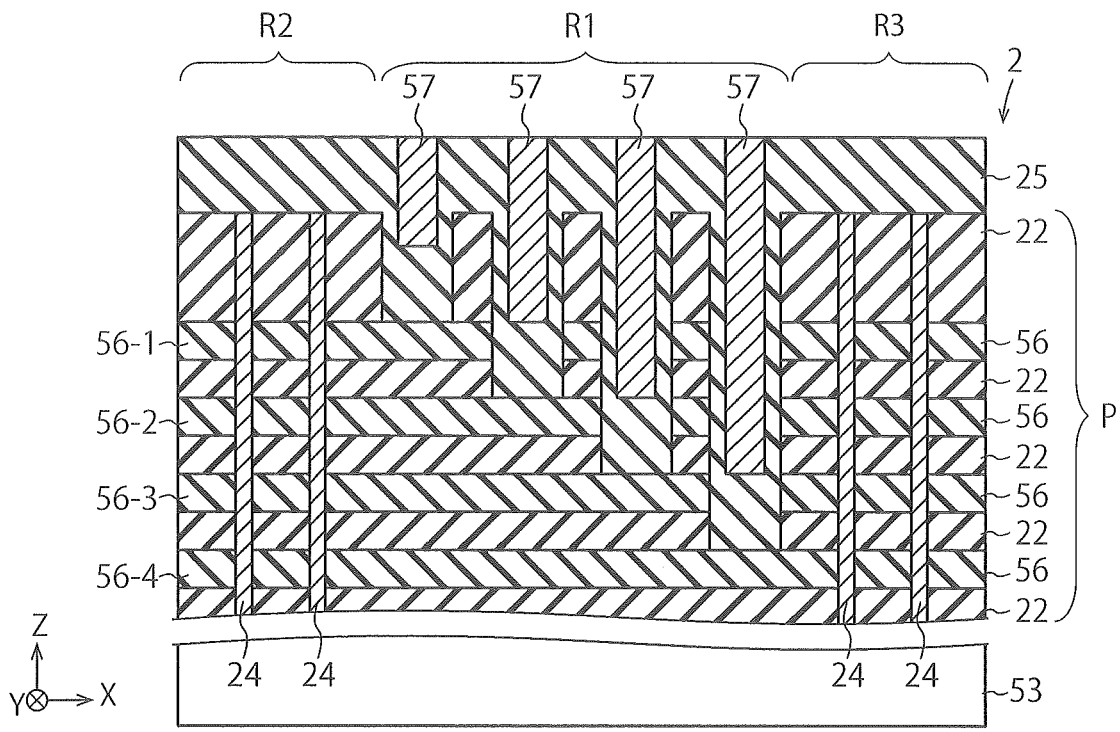

Then, after the sacrifice layer 57 is formed on the entire surface of the substrate 53, and the sacrifice layer 57 is formed inside the openings H1 and outside the openings H1, the sacrifice layer 57 outside the openings H1 is removed through etch back (FIG. 19A). As a result, the sacrifice layer 57 is embedded into the respective openings H1 via the insulators 25. The sacrifice layer 57 is, for example, an amorphous silicon layer.

Figure 19B:
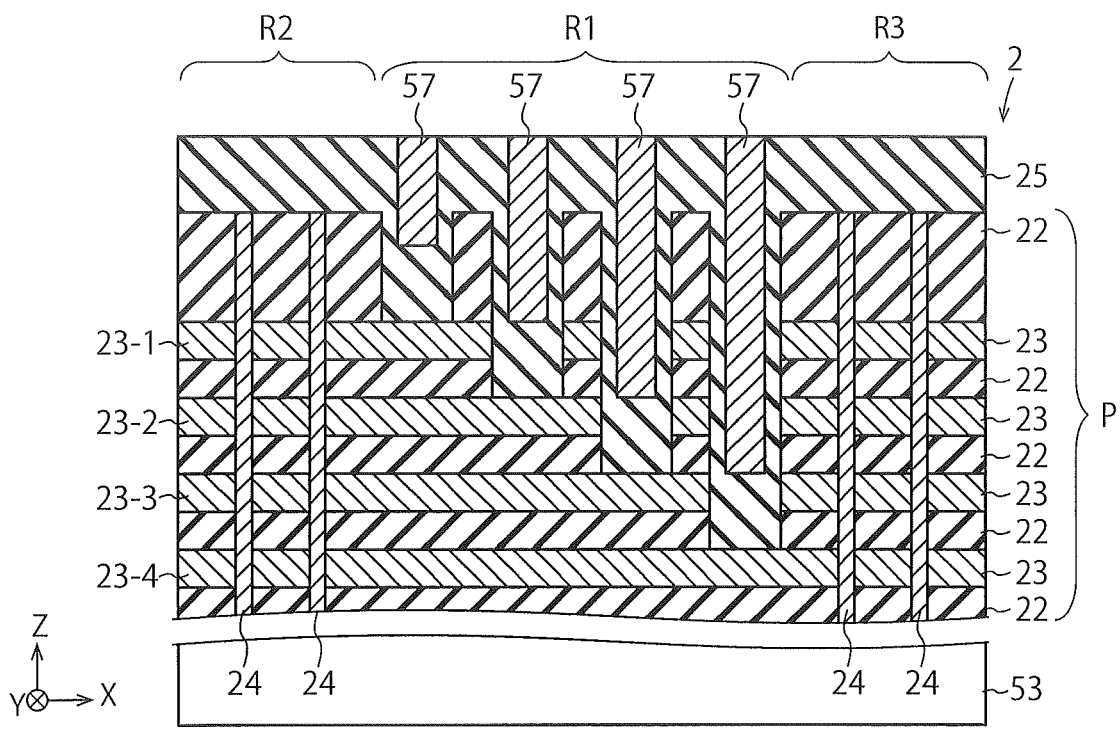

Then, a plurality of slits (not illustrated) are formed in the stacked film P, and the plurality of sacrifice layers 56 are replaced with a plurality of electrode layers 23 using these slits (FIG. 19B). In this manner, the stacked film P which alternately includes the plurality of insulators 22 and the plurality of electrode layers 23 is formed on the substrate 53. The sacrifice layers 56-1 to 56-4 are respectively replaced with the electrode layers 23-1 to 23-4.

The above-described replacement is, for example, performed as follows. First, the sacrifice layers 56 are removed from the slits through wet etching. As a result, a plurality of cavities are formed between the insulators 22 in the stacked film P. Then, a material of the electrode layer 23 is embedded into these cavities from the slits. As a result, the electrode layers 23 are formed in these cavities. The slits are, for example, formed at positions of the insulators 54 illustrated in FIG. 15 and embedded with the insulators 54 after the above-described replacement.

Figure 20A:
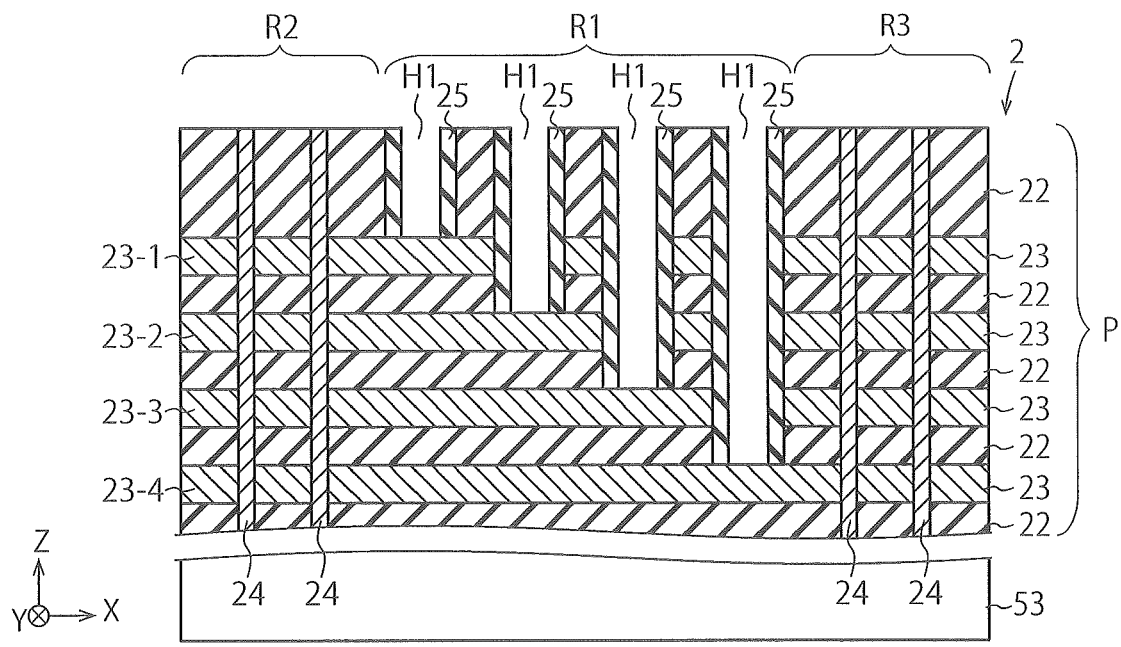

Then, the sacrifice layers 57 are removed from the respective openings H1 (FIG. 20A). Further, the insulators 25 are removed from bottom portions of the respective openings H1 through RIE (FIG. 20A). As a result, upper surfaces of the electrode layers 23 are exposed at the bottom portions of the respective openings H1.

Figure 20B:
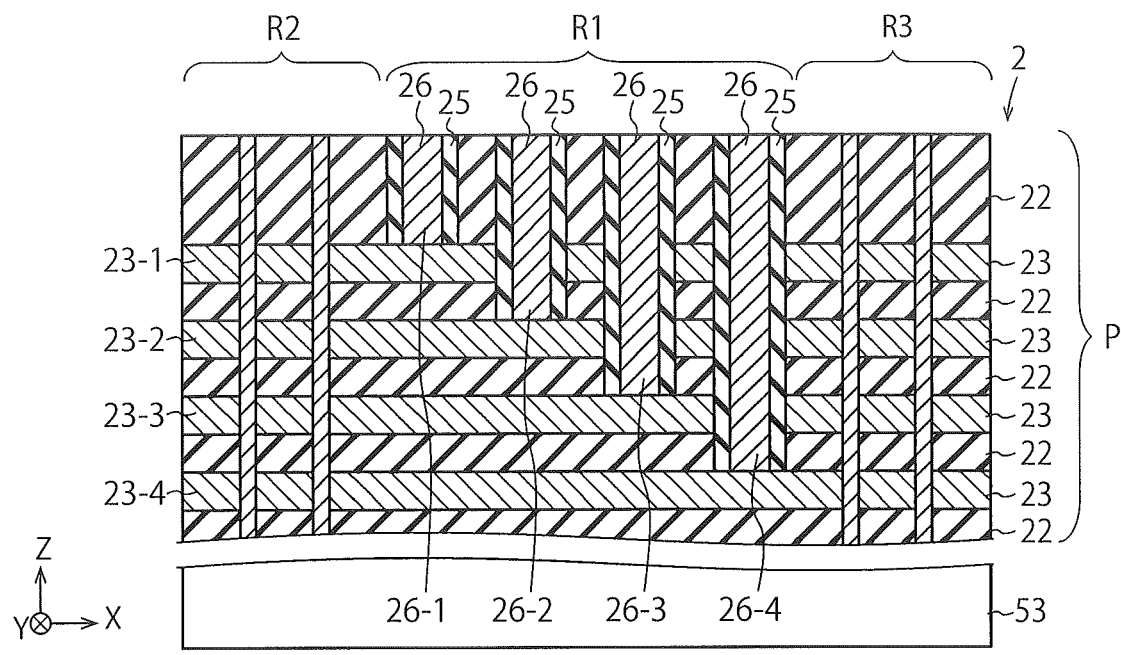

Then, after a material of the contact plug 26 is formed on the entire surface of the substrate 53 and the material is formed inside the openings H1 and outside the openings H1, the material formed outside the openings H1 is removed through CMP (FIG. 20B). As a result, the contact plugs 26 are embedded into the respective openings H1 via the insulators 25. Each contact plug 26 is, for example, a metal layer including a tungsten (W) layer.

FIG. 20B illustrates four contact plugs 26-1 to 26-4 as examples of the contact plugs 26. The contact plugs 26-1 to 26-4 are respectively formed on the upper surfaces of the electrode layers 23-1 to 23-4 and are electrically connected to the electrode layers 23-1 to 23-4.

Thereafter, the rest of process illustrated in FIG. 6 and the process illustrated in FIG. 7 are performed. In this manner, the semiconductor device illustrated in FIG. 1 is manufactured.

As described above, the semiconductor device of the present embodiment includes the region R1 including a plurality of contact plugs 26, and the regions R2 and R3 including a plurality of columnar portions 24, and the region R1 is provided between the region R2 and the region R3. In the present embodiment, further, the transistors 13 for the contact plugs 26 are provided in at least the regions R2 and R3. The present embodiment therefore makes it possible to reduce density of the interconnections 51-1 to 51-8 in the semiconductor device. For example, by extending part of the interconnections 51-1 to 51-8 from the region R1 toward the region R2 and extending another part of the interconnections 51-1 to 51-8 from the region R1 toward the region R3, it is possible to reduce density of the interconnections 51 both in the region R2 and in the region R3.

SECOND EMBODIMENT

Figure 21:
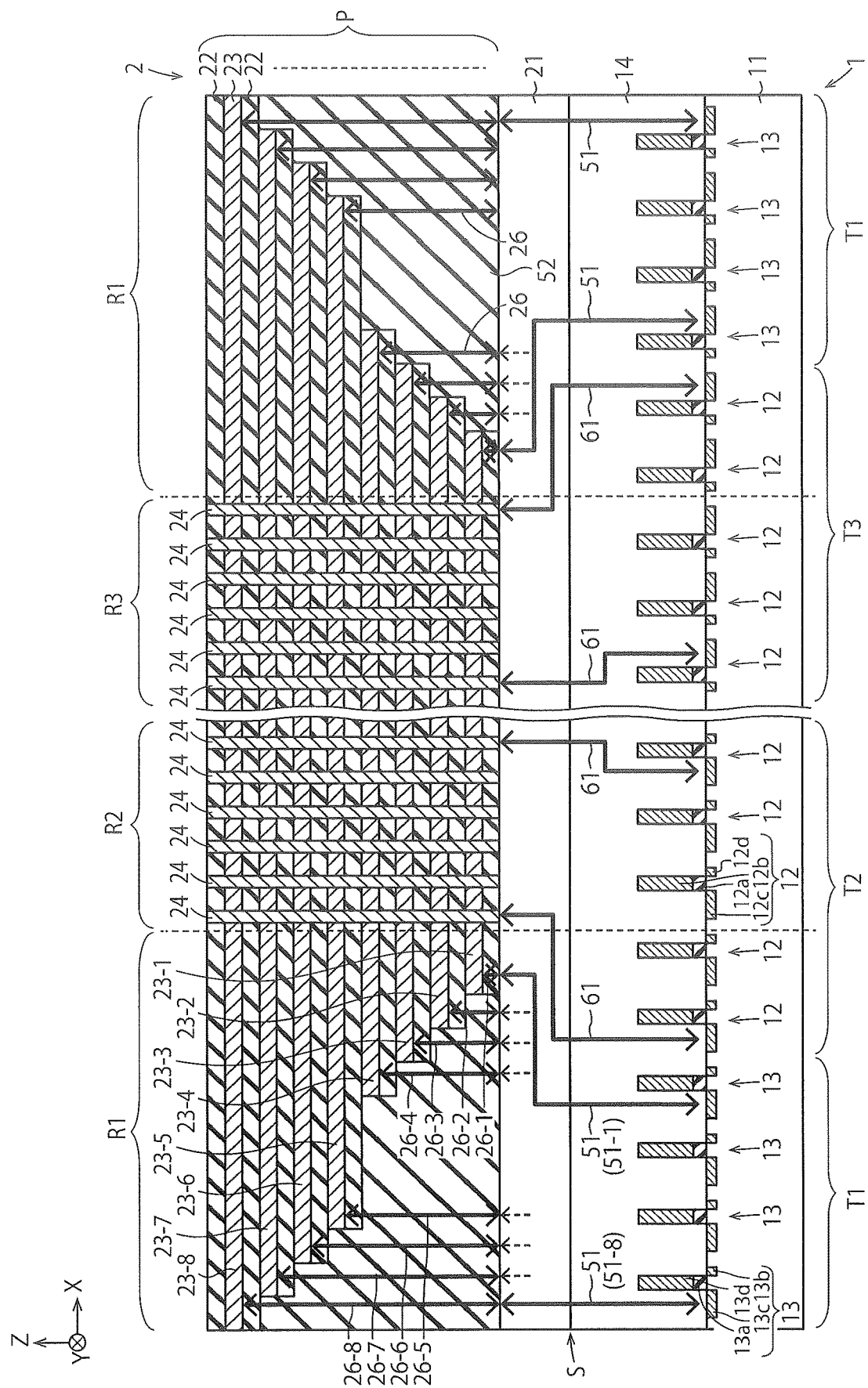
FIG. 21 is a cross-sectional diagram illustrating a structure of a semiconductor device of a second embodiment.

FIG. 21 is a cross-sectional diagram illustrating a structure of a semiconductor device of a second embodiment.

The semiconductor device (FIG. 21) of the present embodiment includes a circuit portion 1 and an array portion 2 which are bonded together in a similar manner to the semiconductor device (FIG. 1) of the first embodiment. The circuit portion 1 in FIG. 21 includes a substrate 11, a plurality of transistors 12, a plurality of transistors 13, an inter layer dielectric 14, a plurality of contact plugs 31, an interconnection layer 32, a plurality of via plugs 33, an interconnection layer 34, a plurality of via plugs 35 and a plurality of metal pads 36. The array portion 2 in FIG. 21 includes an inter layer dielectric 21, a plurality of insulators 22, a plurality of electrode layers 23, a plurality of columnar portions 24, a plurality of insulators 25, a plurality of contact plugs 26, a plurality of metal pads 41, a plurality of via plugs 42, an interconnection layer 43, a plurality of via plugs 44, an interconnection layer 45 and a plurality of via plugs 46. FIG. 21 further illustrates a surface S where the circuit portion 1 and the array portion 2 are bonded together, and the stacked film P in the array portion 2.

However, illustration of the insulators 25, the contact plugs 31, the interconnection layer 32, the via plugs 33, the interconnection layer 34, the via plugs 35, the metal pads 36, the metal pads 41, the via plugs 42, the interconnection layer 43, the via plugs 44, the interconnection layer 45 and the via plugs 46 are omitted in FIG. 21 to facilitate visualization. FIG. 21 further schematically illustrates the contact plugs 26 with solid lines.

The semiconductor device of the present embodiment includes two regions R1, one region R2 and one region R3 in a similar manner to the semiconductor device of the comparative example illustrated in FIG. 16. In FIG. 21, the regions R2 and R3 are put between these regions R1.

The left region R1 of the present embodiment has a structure substantially similar to the structure of the region R1 of the comparative example illustrated in FIG. 3. Specifically, the stacked film P of the present embodiment has a stepped structure in the left region R1, and the inter layer dielectric 52 is provided under the stepped structure of the stacked film P. As a result, the contact plug 26-K (K is an integer which satisfies $2 \leq K \leq 8$) of the present embodiment does not penetrate through the electrode layers 23-1 to 23-(K−1) and is in contact with the electrode layer 23-K. The contact plug 26-K of the present embodiment penetrates through the inter layer dielectric 52 in place of the electrode layers 23-1 to 23-(K−1).

The region R2 of the present embodiment also has a structure substantially similar to the structure of the region R2 of the comparative example illustrated in FIG. 3. Further, the right region R1 and the region R3 of the present embodiment respectively have structures similar to the left region R1 and the region R2 of the present embodiment. Specifically, the stacked film P of the present embodiment has a stepped structure in the right region R1, and the inter layer dielectric 52 is provided also under this stepped structure.

However, the transistors 12 for the columnar portions 24 of the present embodiment are provided in the regions R1, R2 and R3. Meanwhile, the transistors 13 for the contact plugs 26 of the present embodiment are provided only in the region R1 among the regions R1, R2 and R3. The region R1 in the stacked film P of the present embodiment is an example of the first region, and the regions R2 and R3 in the stacked film P of the present embodiment are examples of the second region. Further, the transistors 12 in the region R1 are examples of the first transistor right under the first region, and the transistors 12 in the regions R2 and R3 are examples of the second transistor right under the second region. Further, the side of the +X direction or the side of the −X direction of the present embodiment is an example of the side of the second direction.

FIG. 21 illustrates two regions T1 including the transistors 12, one region T2 including the transistors 13 and one region T3 including the transistors 13. While the region T1 is provided at substantially the same position as the position of the region R1, the region T1 is set narrower than the region R1. While the regions T2 and T3 are provided at substantially the same positions as the positions of the regions R2 and R3, the regions T2 and T3 are set wider than the regions R2 and R3.

FIG. 21 indicates interconnections 51 which electrically connect the contact plugs 26 to the transistors 13 and interconnections 61 which electrically connect the columnar portions 24 to the transistors 12 with solid lines. The contact plugs 26-1 to 26-8 of the present embodiment are respectively electrically connected to the transistors 13 via the interconnections 51-1 to 51-8 in a similar manner to a case of the first embodiment. FIG. 21 indicates the interconnections 51-1 and 51-8 among the interconnections 51-1 to 51-8 with solid lines and illustration of the interconnections 51-2 to 51-7 are omitted with dashed lines. The interconnections 51 and 61 are formed with the contact plugs 31, the interconnection layer 32, the via plugs 33, the interconnection layer 34, the via plugs 35, the metal pads 36, the metal pads 41, the via plugs 42, the interconnection layer 43, the via plugs 44, the interconnection layer 45, and the via plugs 46.

The present embodiment makes it possible to reduce, for example, area of the region R1 in planar view by disposing the transistors 12 also in the region R1 as well as in the regions R2 and R3. This makes it possible to dispose the transistors 12 and the interconnections 61 in a sufficiently wide region and reduce area of the substrate 11 in planar view. As a result, it is possible to improve integration of the semiconductor device of the present embodiment.

The semiconductor device of the first or the second embodiment may be a device other than a three-dimensional semiconductor memory. Further, the semiconductor device of the first or the second embodiment may be manufactured by wafers other than the circuit wafer and the array wafer being bonded together or may be manufactured without wafers being bonded together.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a plurality of transistors provided on the substrate;
   a first stacked film provided above the plurality of transistors, including a plurality of first electrode layers separated from each other in a first direction, and including a first region, a second region located on a side of a second direction with respect to the first region, and a third region located on an opposite side of the second direction with respect to the first region, the second direction intersecting the first direction;
   a second stacked film located on a side of a third direction with respect to the first stacked film, including a plurality of second electrode layers separated from each other in the first direction, and including a fourth region located on a side of the third direction with respect to the third region, a fifth region located on a side of the second direction with respect to the fourth region, and a sixth region located on an opposite side of the second direction with respect to the fourth region, the third direction intersecting the first and the second directions;
   a plurality of first electrode layer plugs respectively provided to the plurality of first electrode layers in the first region;
   a first columnar portion provided in the second region, and including a first semiconductor layer extending in the first direction and a first charge storage layer provided between the first semiconductor layer and the plurality of first electrode layers;
   a second columnar portion provided in the third region, and including a second semiconductor layer extending in the first direction and a second charge storage layer provided between the second semiconductor layer and the plurality of first electrode layers;
   a plurality of second electrode layer plugs respectively provided to the plurality of second electrode layers in the fourth region;
   a third columnar portion provided in the fifth region, and including a third semiconductor layer extending in the first direction and a third charge storage layer provided between the third semiconductor layer and the plurality of second electrode layers; and
   a fourth columnar portion provided in the sixth region, and including a fourth semiconductor layer extending in the first direction and a fourth charge storage layer provided between the fourth semiconductor layer and the plurality of second electrode layers,
   wherein
      at least one first electrode layer among the plurality of first electrode layers includes a first portion included in the first region, a second portion included in the second region, and a third portion included in the third region, and is a continuous film from the second portion to the third portion via the first portion,
      at least one second electrode layer among the plurality of second electrode layers includes a fourth portion included in the fourth region, a fifth portion included in the fifth region, and a sixth portion included in the sixth region, and is a continuous film from the fifth portion to the sixth portion via the fourth portion, and the plurality of transistors include a first transistor provided right under the first region and electrically connected to a first plug among the plurality of first electrode layer plugs, a second transistor provided right under the second region and electrically connected to a second plug among the plurality of first electrode layer plugs, a third transistor provided right under the fourth region and electrically connected to a third plug among the plurality of second electrode layer plugs, and a fourth transistor provided right under the sixth region and electrically connected to a fourth plug among the plurality of second electrode layer plugs.

2. The device of claim 1, further comprising:

a plurality of first interconnections that electrically connect the plurality of first electrode layer plugs respectively to the plurality of transistors; and a plurality of second interconnections that electrically connect the plurality of second electrode layer plugs respectively to the plurality of transistors, wherein the plurality of first interconnections include an interconnection that reaches a region right under the second region, and the plurality of second interconnections include an interconnection that reaches a region right under the sixth region.

3. The device of claim 1, wherein the plurality of second electrode layers are divided from the plurality of first electrode layers.

* * * * *